(12) United States Patent
Kihara et al.

(10) Patent No.: US 8,121,484 B2
(45) Date of Patent: Feb. 21, 2012

(54) BI-DIRECTION OPTICAL MODULE INSTALLING LIGHT-EMITTING DEVICE AND LIGHT-RECEIVING DEVICE IN SIGNAL PACKAGE

(75) Inventors: Toshiaki Kihara, Yokohama (JP); Hiromi Nakanishi, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 425 days.

(21) Appl. No.: 12/430,520

(22) Filed: Apr. 27, 2009

(65) Prior Publication Data
US 2009/0269067 A1    Oct. 29, 2009

Related U.S. Application Data

(60) Provisional application No. 61/071,421, filed on Apr. 28, 2008.

(30) Foreign Application Priority Data

Aug. 4, 2008  (JP) .................... P2008-200819
Jan. 8, 2009  (JP) .................... P2009-002316

(51) Int. Cl.
*H04J 14/02* (2006.01)
*H04B 10/00* (2006.01)
(52) U.S. Cl. ............... 398/85; 398/86; 398/88; 398/135; 398/138
(58) Field of Classification Search .............. 398/138, 398/135, 122, 121, 85, 86, 87, 88
See application file for complete search history.

(56) References Cited

U.S. PATENT DOCUMENTS

| | | | | |
|---|---|---|---|---|
| 6,323,977 | B2 * | 11/2001 | Shou et al. | 398/135 |
| 7,093,988 | B2 * | 8/2006 | Tsumori | 385/93 |
| 7,281,865 | B2 * | 10/2007 | Baek et al. | 385/92 |
| 7,418,208 | B2 * | 8/2008 | Weigert | 398/135 |
| 7,438,480 | B2 * | 10/2008 | Okada et al. | 385/88 |
| 7,478,953 | B2 * | 1/2009 | Tanaka | 385/89 |
| 7,556,439 | B2 * | 7/2009 | Nakanishi et al. | 385/92 |
| 7,889,993 | B2 * | 2/2011 | Wang et al. | 398/138 |

(Continued)

FOREIGN PATENT DOCUMENTS

JP    2004170798    6/2004

(Continued)

OTHER PUBLICATIONS

Toshiaki Kihara et al, U.S. Appl. No. 12/688,262, "Bi-Directional Optical Subassembly With a WDM Filter Attached to a Cap and a Method to Assemble the Same", filed Jan. 15, 2010.

*Primary Examiner* — Kenneth N Vanderpuye
*Assistant Examiner* — Amritbir Sandhu
(74) *Attorney, Agent, or Firm* — Venable LLP; Michael A. Sartori; Leigh D. Thelen

(57) ABSTRACT

A bi-directional optical module with an improved optical crosstalk between the transmitter unit and the receiver unit is disclosed. The optical module provides the LD, the PD, the WDM filter secured with the block, and the package with the co-axial shape. The block provides a slant surface, where the WDM filter is secured thereon, the bottom surface facing the PD mounted on the package, and an aperture connecting the slant surface and the bottom surface. The PD is enclosed within a space formed by the bottom surface and the primary surface, which electrically and optically isolates the PD from the LD.

11 Claims, 26 Drawing Sheets

U.S. PATENT DOCUMENTS

| | | | |
|---|---|---|---|
| 7,974,539 B2 * | 7/2011 | Song et al. | 398/138 |
| 7,991,290 B2 * | 8/2011 | Tanaka et al. | 398/86 |
| 8,005,367 B2 * | 8/2011 | Nakanishi et al. | 398/138 |
| 2004/0080828 A1 | 4/2004 | Hata et al. | |
| 2004/0100693 A1 | 5/2004 | Cao | |
| 2004/0146304 A1 * | 7/2004 | Kuhara et al. | 398/138 |
| 2004/0213317 A1 | 10/2004 | Hashimoto et al. | |
| 2005/0156198 A1 | 7/2005 | Okada et al. | |
| 2005/0180755 A1 * | 8/2005 | Masahiko | 398/135 |
| 2006/0220038 A1 | 10/2006 | Iguchi et al. | |
| 2006/0269197 A1 | 11/2006 | Uno et al. | |
| 2006/0280411 A1 | 12/2006 | Nishizawa et al. | |
| 2007/0071444 A1 * | 3/2007 | Okada et al. | 398/135 |
| 2007/0122154 A1 * | 5/2007 | Nakanishi et al. | 398/85 |
| 2009/0116838 A1 | 5/2009 | Kihara et al. | |
| 2011/0052125 A1 * | 3/2011 | Lee et al. | 385/88 |

FOREIGN PATENT DOCUMENTS

| | | |
|---|---|---|
| JP | 2004271921 | 9/2004 |
| JP | 2005215219 | 8/2005 |

* cited by examiner

BI-DIRECTION OPTICAL MODULE INSTALLING LIGHT-EMITTING DEVICE AND LIGHT-RECEIVING DEVICE IN SIGNAL PACKAGE

CROSS REFERENCE TO RELATED APPLICATIONS

This application claims the benefit of U.S. Provisional Patent application 61/071,421 filed Apr. 28, 2008, the disclosure of which is incorporated herein by reference.

BACKGROUND OF THE INVENTION

1. Field of the Invention

The present invention relates to a bi-directional optical module able to transmit and receive optical signals for a single fiber, in particular, the invention relates to an optical module that installs a light-transmitting device and a light-receiving device within a single package.

2. Related Background Art

The metro-optical communication system has bee developed and become popular. This system, for using already existing optical fiber effectively, applies an arrangement where the optical transmission and the optical reception are carried out for the single fiber by differentiating the signal wavelengths. That is, the optical transmission is carried out in a wavelength of 1.31 µm, while, the optical reception is in a wavelength of 1.49 µm or 1.55 µm. These configurations are directed to the digital signals. Recently, further request to transmit an analogue signal in addition to those digital signals has been occurred. Such a system transmits the analog signal in the wavelength of 1.55 µm, while, the digital receiving signal is assigned to the wavelength of 1.49 µm.

A bi-directional optical assembly (hereafter denoted as BOSA) or an optical module applied in such communication system had an arrangement that assembles separate packages each for the optical transmitting device and the optical receiving device with the wavelength division multiplexing filter (hereafter denoted as WDM filter). Such an arrangement, although the devices are able to be developed and generalized independently, is necessary to assemble respective devices with the WDM filter. Moreover, the individually packaged configuration inevitably results in the large sized housing of the module.

A modified arrangement has been proposed to solve the subjects above, where a light-emitting device, typically a semiconductor laser diode (hereafter denoted as LD), and a light-receiving device, typically a photodiode (PD), are housed within a single package. The U.S. Pat. No. 7,093,988 has disclosed an example of such a bi-directional module with single package. This optical module installs an LD and a PD within the single co-axial package. The LD emits light in a direction parallel to the stem of the package. This light couples with the optical fiber attached with an optical ferrule in the end thereof after it is reflected by substantially a right angle by the WDM filter to a direction perpendicular to the stem of the package and concentrated by the lens.

On the other hand, light emitted from the optical fiber may couple with the PD mounted on the stem after it is concentrated by the lens and passes through the WDM filter. Thus, the WDM filter is an optical device that reflects the light emitted from the LD while passes the light provided from the optical fiber to couple with the PD.

This bi-direction module with the single package inherently has a subject of the optical isolation and the electrical isolation between the transmitting unit and the receiving unit. That is, the LD in the transmitting unit emits the modulated light synchronized with the switching current supplied thereto. To turn off and on a large current inevitably induces the electro-magnetic interferential noise. On the other hand, the PD converts a faint optical signal, the optical power of which is occasionally smaller than a several hundreds microwatts, into a corresponding electrical signal typically smaller than several mV; thus, the EMI noise caused by the switching current affects the receiving condition of the PD.

Moreover, an optical isolation deteriorates by the diffusive reflection of the light emitted from the LD. Specifically, the light emitted from the LD may couple with the PD after the diffusive reflection within the package. Because the PD generally shows the optical sensitivity in wavelengths of the laser light, this diffusively reflected light degrades the optical isolation of the module. An example shown in the U.S. Pat. No. 7,093,988 provides an additional conductive cap such that it covers the PD and the pre-amplifier which amplifies the faint signal provided from the PD. The cap provides a window, while, the WDM filter is set so as to seal this window. Thus, the cap may electrically isolate the PD and the pre-amplifier from the LD, and concurrently, the cap may optically isolate the PD from the diffusively reflected light from the LD. However, the module shown in U.S. Pat. No. 7,093,988 is necessary to prepare this additional cap independently from the package cap and to widen the stem area because two caps are welded with the stem. The conventional module provides a sleeve also assembled with the stem, which further requests the package to enlarge the size of the stem.

The present invention is to provide an arrangement, in a bi-directional optical module with a type of a single package that realizes both the electrical and the optical isolation between the transmission unit and the reception unit without enlarging the package size.

SUMMARY OF THE INVENTION

One aspect of the present invention relates to a configuration of an optical module that emits the first light with the first wavelength to the single fiber and receives the second light with the second wavelength from the single fiber. The optical module may comprise an LD as a light-emitting device to emit the first light, a PD as a light-receiving device to receive the second light, a WDM filter, a block to secure the WDM filter thereon, and a package to mount the LD, the PD, and the block with the WDM filter thereon. The WDM filter reflects the first light emitted from the LD to the single fiber, while, it transmits the second light provided from the single fiber to the PD. In the present invention, the block has a slant surface to secure the WDM filter, a bottom surface facing the PD, and an aperture connecting the slant surface with the bottom surface to transmit the second light. Thus, the PD may be set within a space formed by the bottom surface and the primary surface of the package.

In the present invention, the aperture of the block may have a triangular horizontal cross section in parallel to the primary surface. Moreover, the aperture may have at least two side surfaces, a distance of which becomes narrower with a distance from the LD. A portion of the first light emitted from the LD is reflected by the side surfaces of the aperture but the light reflected at the side surfaces does not head for the PD, which effectively reduces the crosstalk.

The block may further provide a pair of side walls and a support wall between the side walls. The support wall provides the slant surface and the bottom surface in the top and the bottom thereof. The side walls, the bottom surface, and the primary surface of the package may form the space where the PD is enclosed. Thus, the PD is effectively isolated not only in optical but in electrical from the LD.

The LD may be mounted on the primary surface of the package through the Sub-mount. The sub-mount may be put between the side walls of the block. Thus, the space to enclose the PD therein may be further effectively isolated from the LD.

The block of the present invention may have the support wall and a front wall. The front wall is arranged in a side of the LD. In this arrangement, the front wall, the bottom surface and the primary surface of the package form the space to enclose the PD therein effectively. The Sub-mount may provide a pair of side walls to put the block therebetween. In this arrangement, the space to enclose the PD may be formed by the side walls of the Sub-mount, the front wall, the bottom surface and the primary surface of the package, which may further effectively isolate the PD from the LD in electrical and in optical. The bottom of the front wall of the block may be directly come in contact with the primary surface of the package.

The Sub-mount of the present invention may provide a dead area in front of the LD, that is, the LD is mounted in an innermost position by the dead area on the sub-mount. A portion of the first light, the ray trace of which directly heads the PD, emitted from the LD may be effective reflected by the dead area toward directions not heading the PD, which may effectively reduce the optical crosstalk.

Another aspect of the present invention relates to a method to assemble the optical module with a bi-directional function to emit first light with the first wavelength and to receive second light with the second wavelength. The method comprises steps of: (a) mounting the LD as a light-emitting device and the PD as a light-receiving device on a primary surface of the package; (b) setting the WDM filter on the primary surface through the block; and (c) optically aligning the WDM filter with respect to the LD, and the PD by sliding the block on the primary surface along a line connecting the LD with the PD. The aligning step of the WDM filter may include a step to inspect the light-emitting surface of the LD reflected by the WDM filter and the light-receiving surface of the PD transmitted through the WDM filter at the same time. The inspection of the light-emitting surface and the light-receiving surface may be carried out by a CCD camera.

These and other exemplary embodiments, features, aspects, and advantages of the present invention will be described and become apparent from the following detailed description of exemplary embodiments, which is to be read in connection with the accompanying drawings.

BRIEF DESCRIPTION OF THE DRAWINGS

FIG. 26A is the transmittance of the WDM filter for the ONU application, which is the same with FIG. 7, while.

DESCRIPTION OF THE PREFERRED EMBODIMENTS

Next, preferred embodiments of the present invention will be described as referring to accompanying drawings. In the description of the drawings, the same numerals or the same symbols will refer to the same elements without overlapping explanations.

First Embodiment

Figure 1:
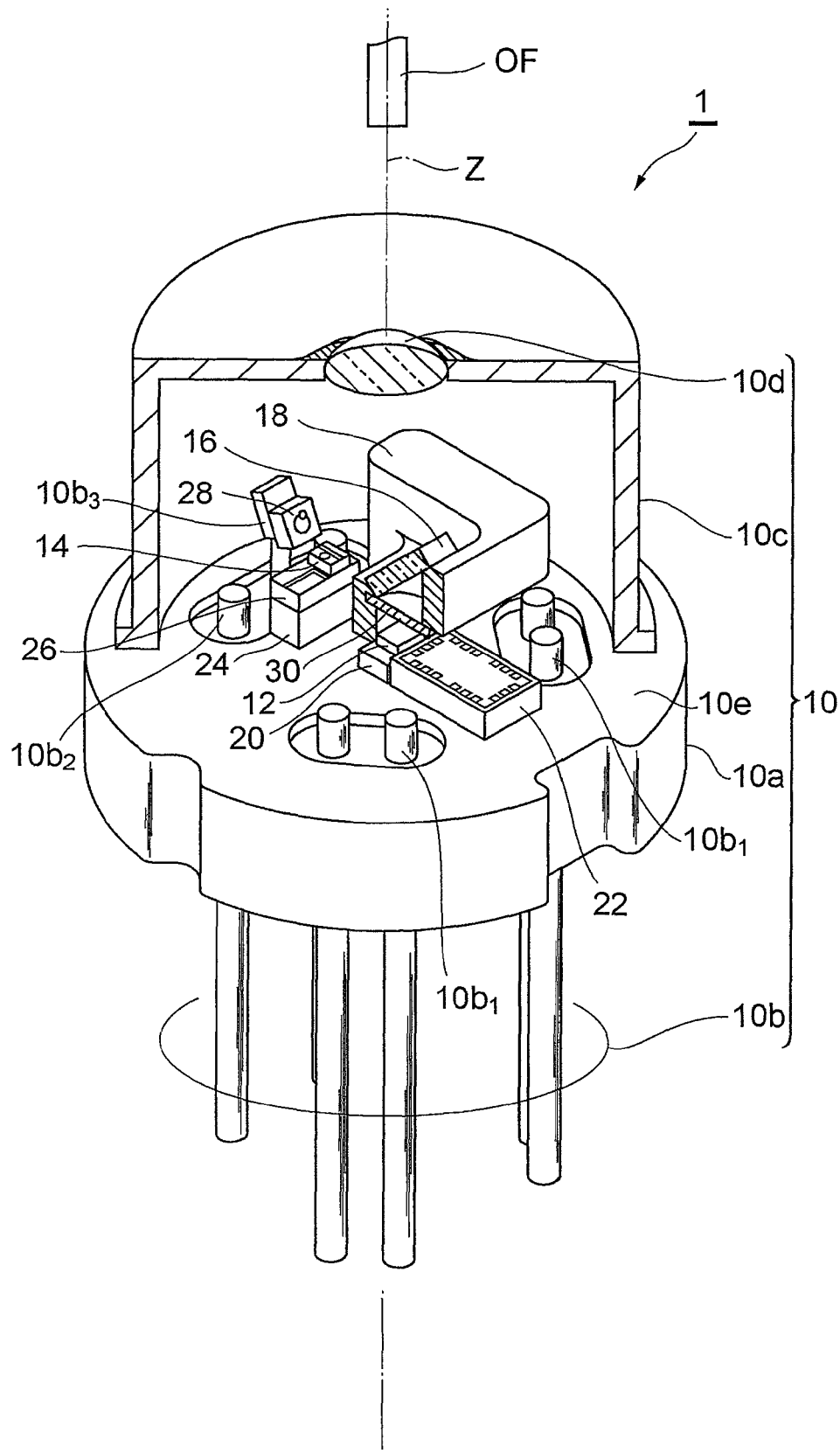
FIG. 1 is a perspective view of an optical module according to the first embodiment of the present invention.
Figure 2:
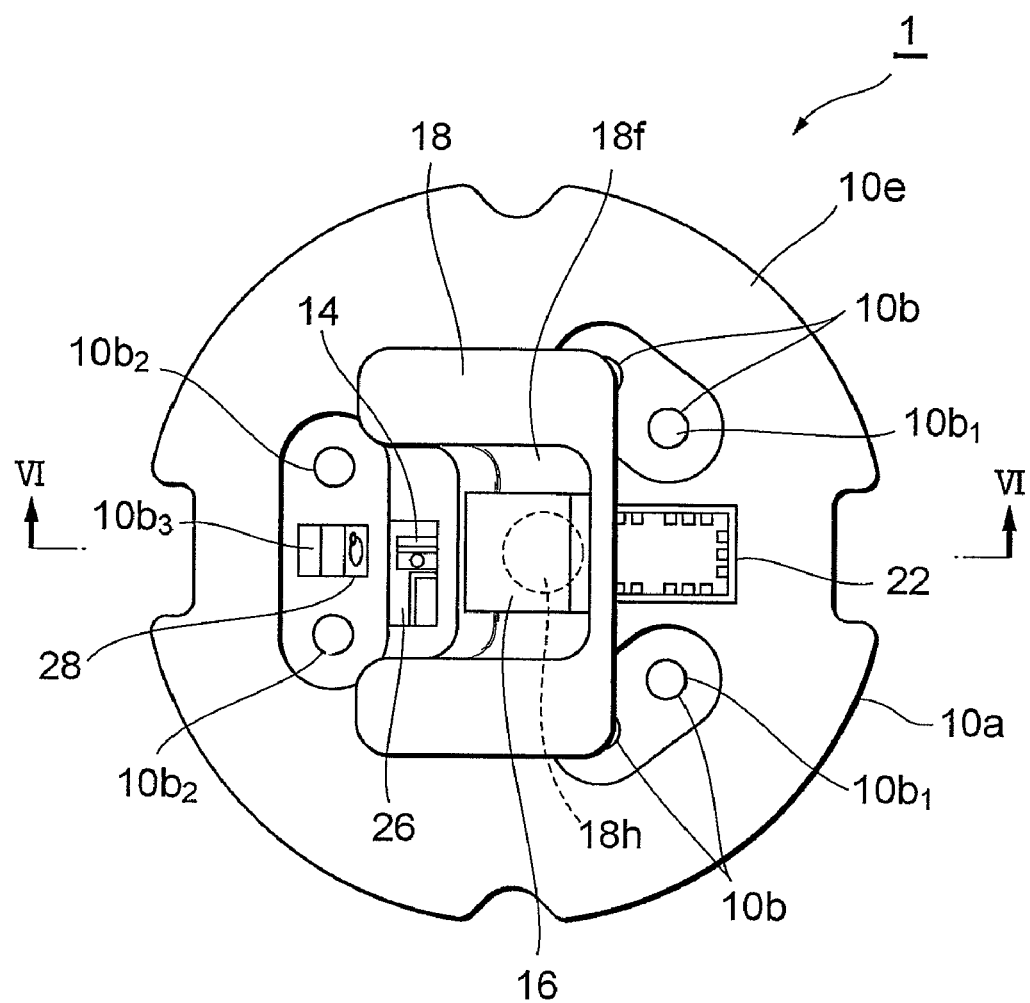
FIG. 2 is a plan view of the optical module shown in FIG. 1.

FIG. 1 is a perspective view of the bi-directional module according to the first embodiment of the present invention, while, FIG. 2 is a plan view of the bi-directional module without illustrating the cap, where the module is viewed from a side where the lens is implemented. This type of the bi-directional module is often called as a bi-directional optical subassembly (BOSA). The optical module 1 provides a package 10, a PD 12, an LD 14, a WDM filter 16 and a block 18.

The package 10 installs and encloses the PD 12, the LD 14, the WDM filter 16 and the block 18. The package 10 comprises a stem 10a, a plurality of lead pins 10b, a cap 10c, and a lens 10d. The stem 10a that have a substantially disk shape is made of metal, and provides a primary surface 10a that sets the PD 12, the LD 14, the WDM filter 16 and the block 18 thereon. The stem 10a also provides a plurality of holes to pass the lead pins 10b therethrough. Between the stem 10a and the lead pin is filled with, for instance, a seal glass to isolate them electrically. The PD 12 and the LD 14 are electrically coupled with respective lead pins 10b.

The cap 10c, which is a disk shaped metal member also, has an end fixed to the primary surface 10e of the stem 10 and another end that sets the lens 10d. The cap 10c is fixed to the primary surface 10a by, for instance, the projection welding, while, secures the lend 10d in the other end thereof by a sealant such as seal glass.

The PD 12 receives the light with a first wavelength that is provided from the single optical fiber OF and passes through the lens 10c. The first wavelength may be 1.49 μm or 1.55 μm. In the optical module 1, the PD 12 is mounted on a center portion of the primary surface 10e through a PD sub-mount 20. Immediate to the PD 12 is a pre-amplifier 22 to amplify a photocurrent generated by the PD 12. The complementary output from the pre-amplifier 22 may be brought out through lead pins $10b_1$ each arranged in an immediate side of the pre-amplifier 22. Specifically, two lead pins $10b_1$ are arranged in both sides of the pre-amplifier 22 and in a direction perpendicular to the direction connecting the pre-amplifier 22 with the PD 12. Accordingly, the pre-amplifier 22 is directly mounted on the primary surface 10e of the stem 10a without any members in a center of an isosceles triangle formed by two lead pins 10b and the PD 12.

The LD 14 emits light with the second wavelength of, for instance, 1.31 μm. The light emitted from the LD 14 advances substantially in parallel with the primary surface 10e, is reflected by the WDM filter 16 and is concentrates by the lens 10d to couple with the optical fiber OF. The LD 14 is mounted in an opposite position of the PD 12 with respect to the block 18. That is, the block 18 is set between the PD 12 and the LD 14. The LD 14 is mounted on the primary surface 10e through the LD sub-mount 24 and the wiring substrate 26. Bonding wires electrically connect the interconnections on the wiring substrate 26 with the lead pins $10b_2$ for the LD 14.

The lead pin $10b_3$ arranged behind the LD 14 directly mounts another PD 28 that receives back facet light of the LD 14 and generates a photocurrent corresponding to the magnitude of the back facet light. The photocurrent from the PD 28 is utilized for the auto-power control (hereafter denoted as APC) to keep the optical output from the LD 14 constant. Thus, the PD 28 is often called as Monitor PD hereafter denoted as MPD). The top portion of the lead pin $10b_3$ that mounts this MPD 28 is tilted outwardly, typically 20° to 30°, to prevent the light reflected thereat from returning the LD 14. The stray light re-entering the active layer of the LD 14 causes the optical noise source.

The present optical module 1 has a feature that the module 1 further provides the block 18, which is made of electrically conductive material or insulating material coated with metal, between the transmitter unit (hereinafter called as the Tx unit) installing the LD 14 and the receiving unit (hereinafter called as the Rx unit) that includes the PD 12. The top surface of the block 18 makes an angle of about 45° with respect to the primary surface 10e of the stem 10a and attaches the WDM filter 16 thereto. This arrangement may realize the optical coupling system inherently necessary for the BOSA with the single package. The block 18 between two units may isolate them in both optical and electrical because the block 18 is made of electrically conductive material, or at least coated with the electrically conductive material, to isolate two units in electrical, while, the outer shape of the block 18 may prevent the light emitted from the LD 14 from entering the PD 18.

Next, an arrangement of this block 18 will be described in detail.

Figure 3:
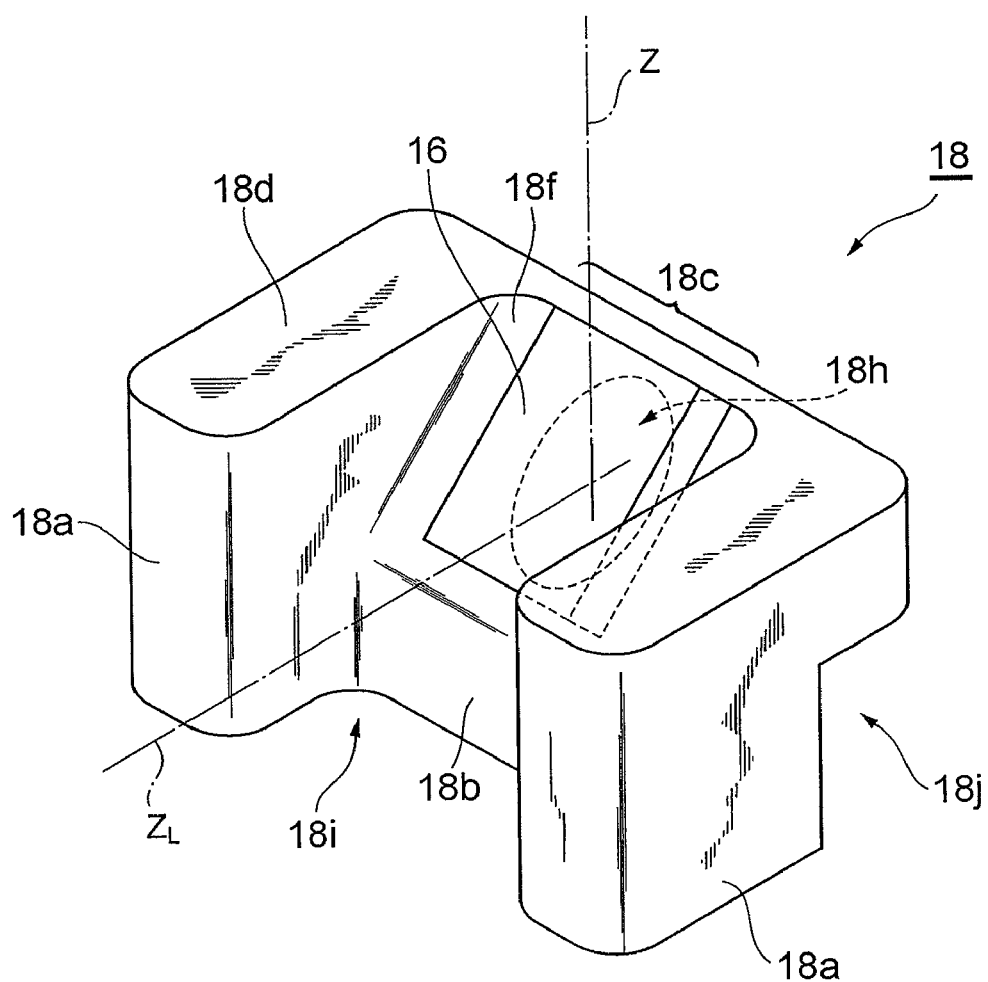
FIG. 3 is a perspective view of a block to secure the WDM filter implemented with the optical module shown in FIG. 1.
Figure 4:
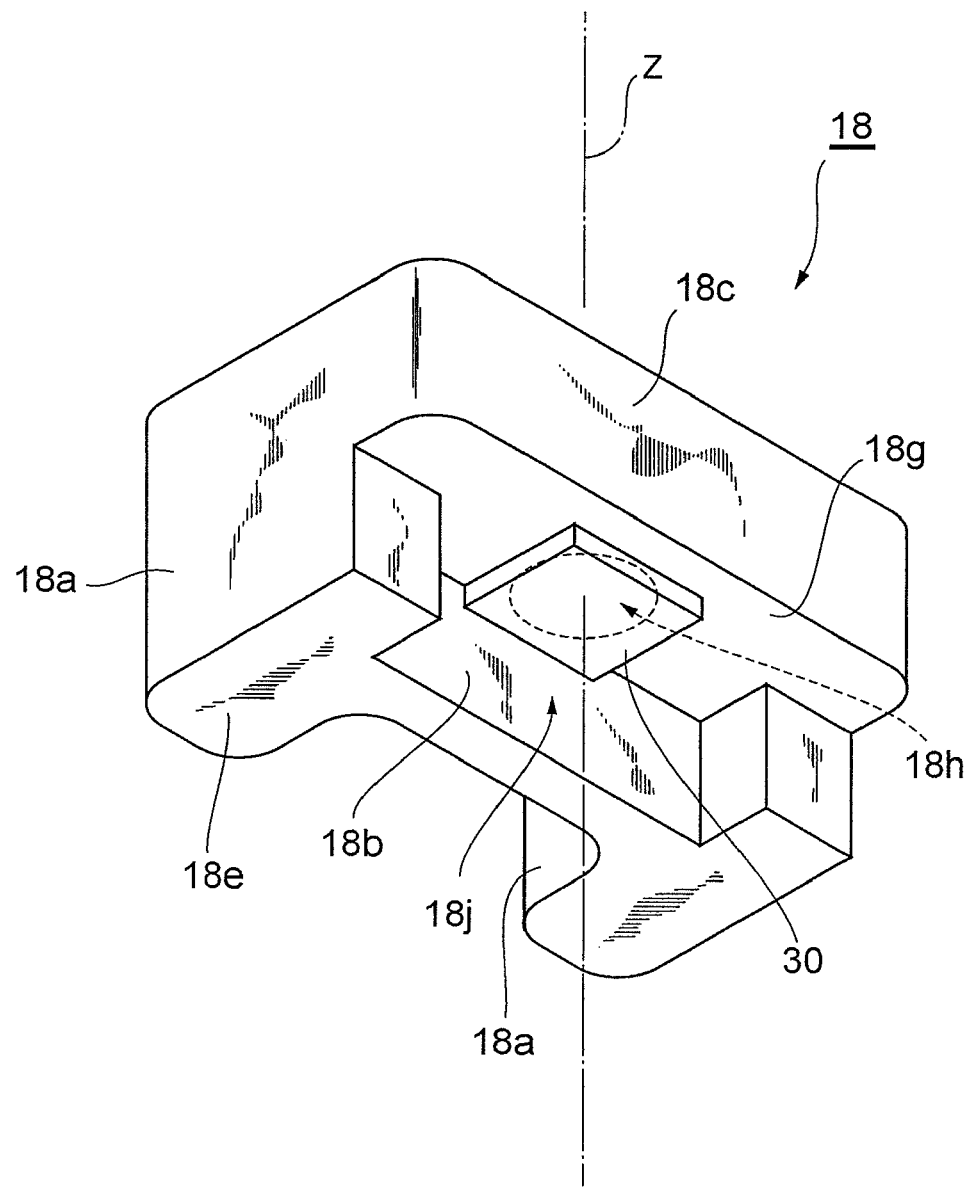
FIG. 4 is a bottom view of the block shown in FIG. 3.
Figure 5:
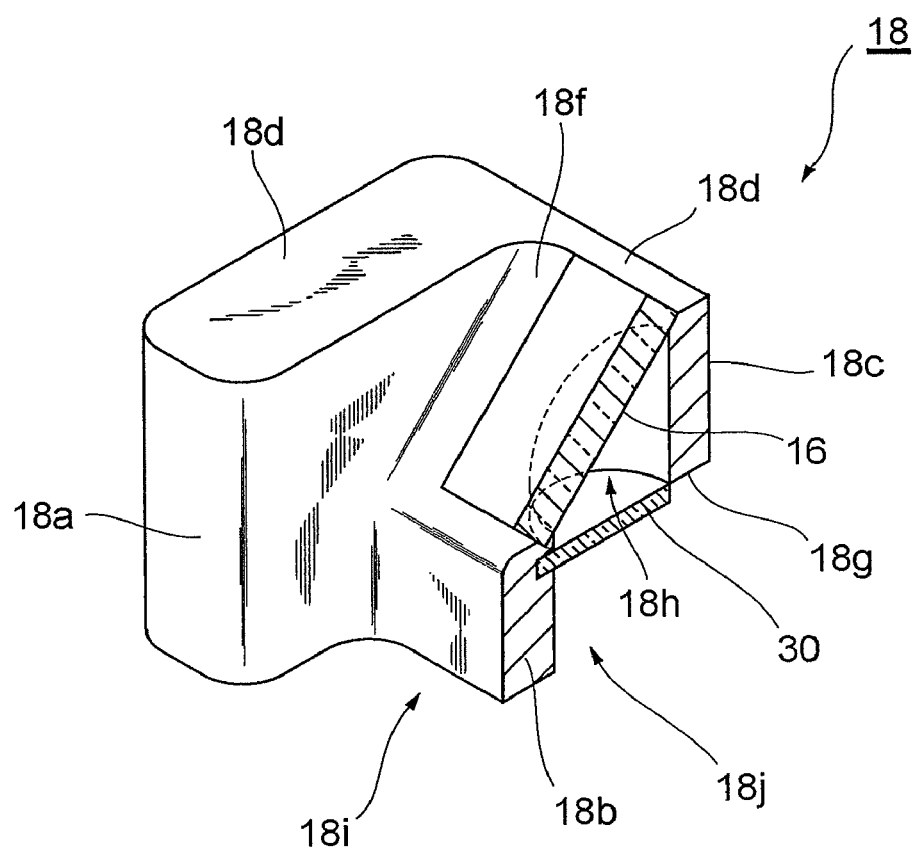
FIG. 5 is a partially cut view of the block shown in FIGS. 3 and 4.

FIGS. 3 and 4 are perspective drawings viewed from the top and from the bottom, respectively. FIG. 5 is a drawing of the block 18, a portion of which is cut to show the geometrical relation of the WDM filter 16 with the block 18. The block 18 has a pair of side walls 18a, a center partition 18b and a support wall 18c. The center partition 18b and the support wall 18c are put between the side walls 18a. The side walls 18a and the support wall 18c constitute the top surface of the block 18. Also, the side walls 18a and the center partition 18b constitute a first bottom surface 18e with an H-shape, which comes in contact with the primary surface 10e of the stem 10a.

The support wall 18c includes the slant surface 18f extending from the top surface 18d and ending with the top of the center partition 18b. The slant surface 18f intersects with the optical axis $Z_L$ of the LD 14, along which the light from the LD 14 propagates, and also with the optical axis Z of the optical fiber OF, along which the light provided from the optical fiber OF propagates. Set on the slant surface 18f is the WDM filter 16.

The support wall 18c further includes a second bottom surface 18g provided between the primary surface 10e and the slant surface 18f when the block 18 is set on the stem 10a. This second bottom 18g faces the primary surface 10e and is apart therefrom. Specifically, a distance from the second bottom surface 18g to the top surface 18d is shorter than a distance from the primary surface 10e to the top surface 18d. The support wall 18c forms an aperture 18h extending from the slant surface 18f to the second bottom surface 18g. In the present embodiment, the aperture 18h is an aperture through which the light with the first wavelength passes. The second bottom surface 18g provides the optical filter 30 so as to cover this aperture 18h. Because the optical filter 30 cuts the light with the second wavelength, stray light emitted from the LD 14 and diffusively reflected may be blocked by the optical filter 30 from entering the PD 12. The present arrangement shown in FIGS. 3 and 4 sets the second bottom surface 18g in parallel with the primary surface 10e and the optical axis of the optical filter 30 becomes substantially in parallel with the optical axis of the PD 12.

The center partition 18b, which corresponds to the horizontal bar of the character "II", extends in a plane whose direction intersects with the optical axis $Z_L$ of the LD 14. The center partition 18b forms a space 18i in the transmitter unit and another space 18j in the receiver unit. The former space 18i is set between the center partition 18b and the LD 14, while, the latter space 18j is set in the side opposite with the former space 18i with respect to the center partition 18b. The center partition 18b extends to the first bottom surface 18e and comes in contact with the primary surface 10e. The latter space 18j is surrounded by the center partition 18b in the side where the LD 14 is mounted, the side walls in both sides thereof, and the second bottom surface 18g with the optical filter 30 in the top thereof. While, the former space 18i is surrounded by the center partition 18b and the side walls 18a.

The former space 18i sets the LD 14 and the LD sub-mount 24 therein, while, the latter space 18j sets the PD 12, the PD sub-mount 20, and so on therein. Therefore, the center partition 18b may electrically isolate two units.

Figure 6:
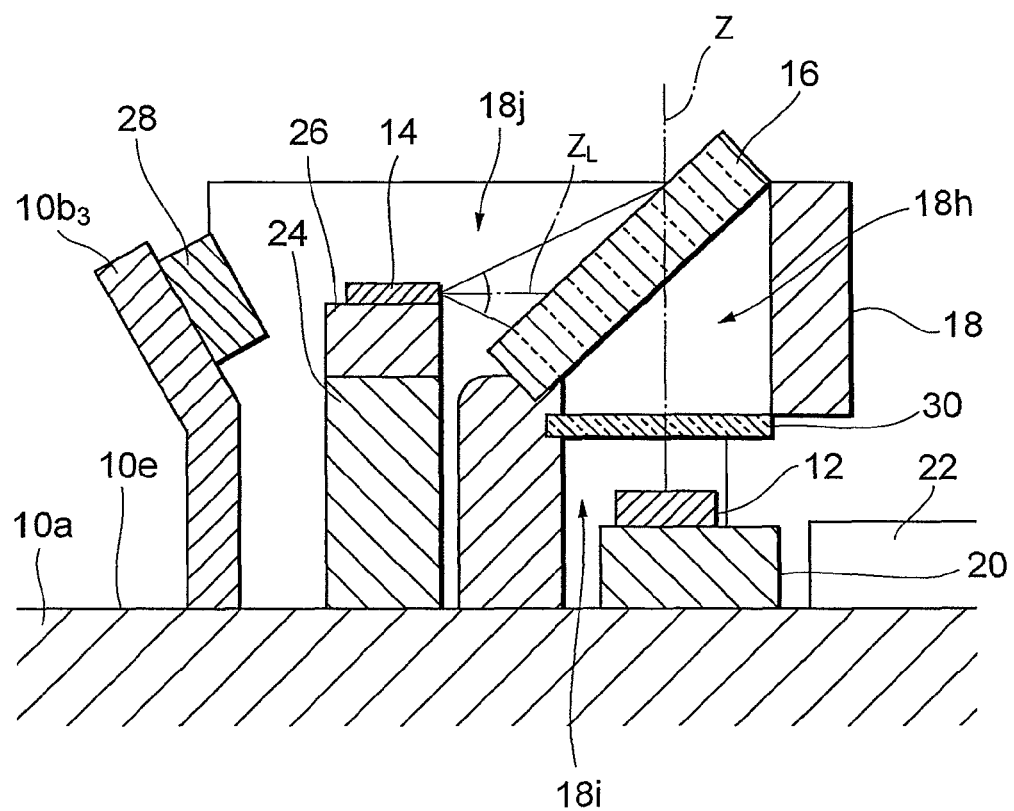
FIG. 6 is a vertical cross section of a primary portion of the optical module, which illustrates the optical arrangement of the components implemented within the optical module.

FIG. 6 is a cross section taken along the ling VI-VI in FIG. 2, which illustrates a geometrical relation between the LD 14, the PD 12, the WDM filter 16 and the block 18. The light emitted from the LD 14 has a Gaussian distribution in the field pattern thereof around the optical axis $Z_L$, whose divergent angle reaches 20°~25°, measured by a term of $1/e^2$, where e is an exponential. Accordingly, the WDM filter 16 is necessary to have the dimensions so as to reflect or transmit fully such beams with large divergent angle. Specifically, the WDM filter 16 is required to reflect the light with a divergent angle of ±30°. However, the performance to distinguish the optical beams with different wavelengths degrades as the incident angle to the WDM filter 16 deviates from 45°.

Figure 7:
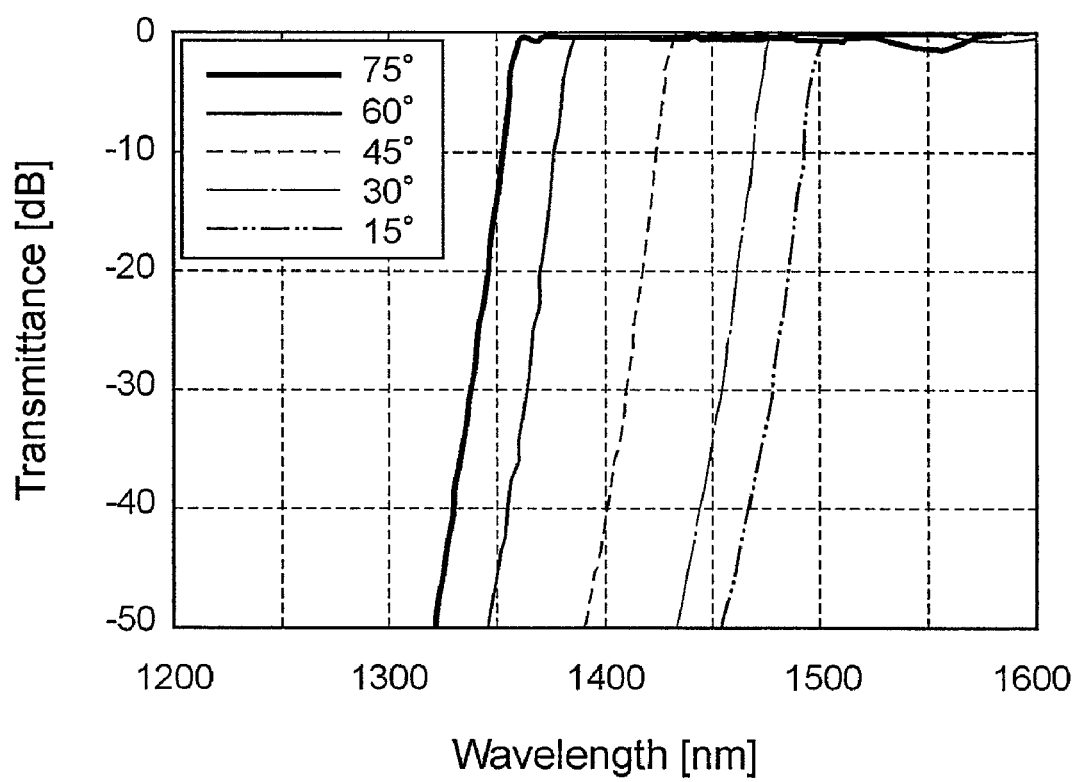
FIG. 7 shows the transmittance of the WDM filter, where the incident angle of the light is shows as parameters.

FIG. 7 shows the dependence of the transmittance of the WDM filter 16 on the incident angle. The WDM filter 16 is designed to reflect light whose wavelength is shorter than 1.31 μm, while, it transmits the light with a wavelength longer than 1.31 μm. Where, the dependence shown in FIG. 7 corresponds to the light with the s-polarization, that is, the polarization vector of the light is perpendicular to the incident plane of the WDM filter 16. As the incident angle increases, the cut-off wavelength of the WDM filter 16 shifts toward a side of the shorter wavelength. Even when the filter is designed such that it reflects whole light beams from the LD 14, whose transmittance becomes nearly equal to zero, with wavelengths shorter than 1.31 μm, the filter becomes to show the substantial transmittance for the light with the wavelength of 1.35 μm at the incident angle of 75°, where it is offset by +30° from the center 45°. Here, because the incident angle is measured to the normal of the primary surface of the WDM filter 16, the incident angle of 75° corresponds to the maximum divergent angle shown in FIG. 6. Such light passing through the WDM filter 16 becomes the stray light and a portion of it possibly couples with the PD 12 after it iterates the reflection within the WDM filter 16 and within the cap.

The block 18 of the present embodiment provides the center partition 18b for isolating the receiver unit from the transmitter unit to prevent such stray light from entering the PD 12. Moreover, the receiver unit provides the second bottom surface 18g with the optical filter 30, which effectively reduces the stray light from entering the PD 12 directly. In the arrangement of the conventional bi-directional module, a space behind the WDM filter is opened such that the stray light probably enters the PD 12. Moreover, the conventional module that installs the transmitter unit and the receiver unit in the signal package is hard to set the cut-filter 30 immediate to the PD. While, the present arrangement, in addition to the center partition 18b, provides the cut filter 30 in the overhang of the block 18 to cut the light emitted from the LD 14.

Second Embodiment

Figure 8A:
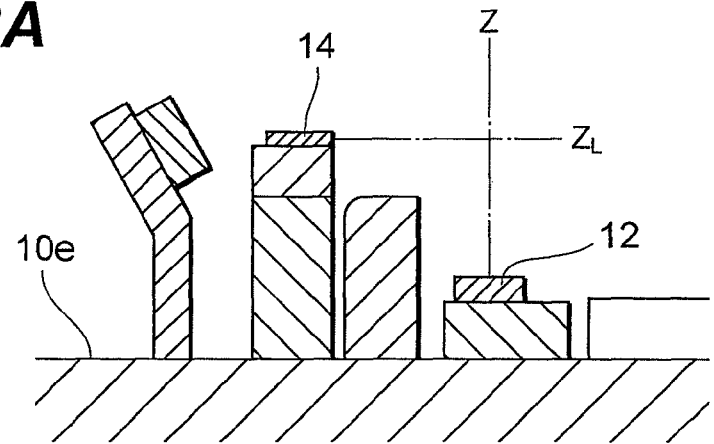
FIG. 8A shows a process to align the LD and the PD with respect to the WDM filter, where the LD and the PD are set on respective preset positions on the stem.
Figure 8B:
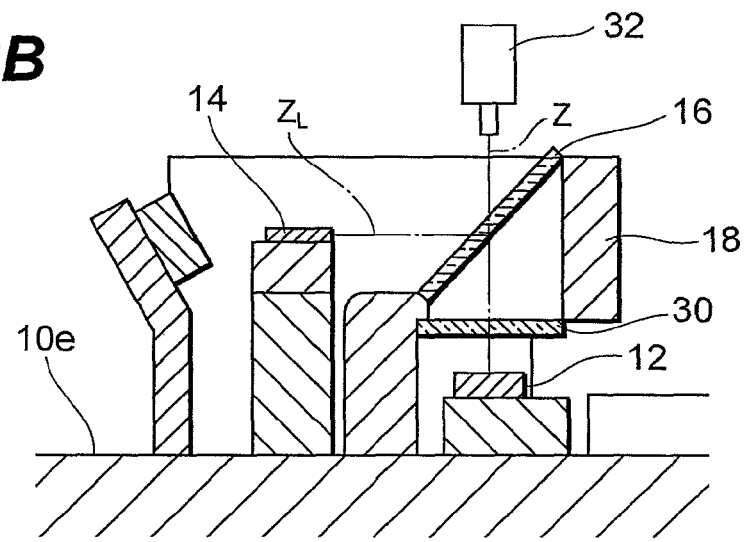
FIG. 8B shows a process subsequent to the process shown in FIG. 8A to align the LD, the PD and the WDM filter.
Figure 8C:
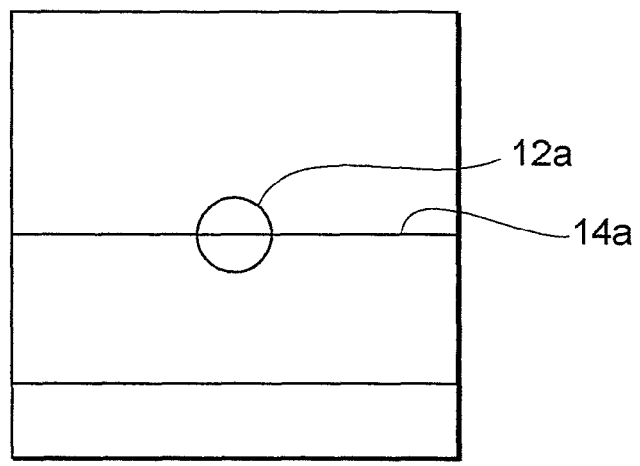
FIG. 8C schematically illustrates a condition where the LD, the PD and the WDM filter are optically aligned with each other.

Next, a method for optically aligning the components within the optical module 1 will be described. In FIG. 8, the direction perpendicular to the primary surface 10e is denoted as Z, while, the direction of the optical axis of the LD 14 is denoted as $Z_L$. First, a die-bonding tool sets the PD 12 and the LD 14 in respective positions on the primary surface 10e within accuracy depending on the tool, as illustrate in FIG. 8A An ordinal bonding tool secures the accuracy of 10 to 15 μm.

Next, setting the visual instrument, such as CCD camera, just above the PD 12, the block 18 mounting the WDM filter 16 is manually placed on the primary surface 10e and is slid along the direction $Z_L$. The visual instrument may recognize the end facet of the LD 14, which is reflected by the WDM filter 16, and the sensitive surface of the PD 12, which passes through the WDM filter 16, shown in FIG. 8B. Sliding the block 18 along the direction $Z_L$, the image of the end facet of the LD 14 moves; accordingly, we may fix the block 18 with an adhesive at the position where the LD image matches with the PD image. Thus, the LD 14 and the PD 12 may be optically aligned with the optical fiber by replacing the visual instrument with the optical fiber, FIG. 8C.

Third Embodiment

The arrangements above described provide the block 18 with the aperture 18h, through which the light passes to enter the PD 12, having a substantially circular shape. The circular opening may be processed only with a drill, which enhances the productivity of the block. However, practical experiments carried out by inventors made it clear that, the circular opening reflects light to every directions, a portion of the light reflected by the edge of the circular opening possibly entered the PD 12. The magnitude of the stray light reflected to one direction could be reduced but it was hard to remove completely. Residual portion of the reflected light entered the PD 12, which deteriorated the crosstalk of the optical module.

Figure 9:
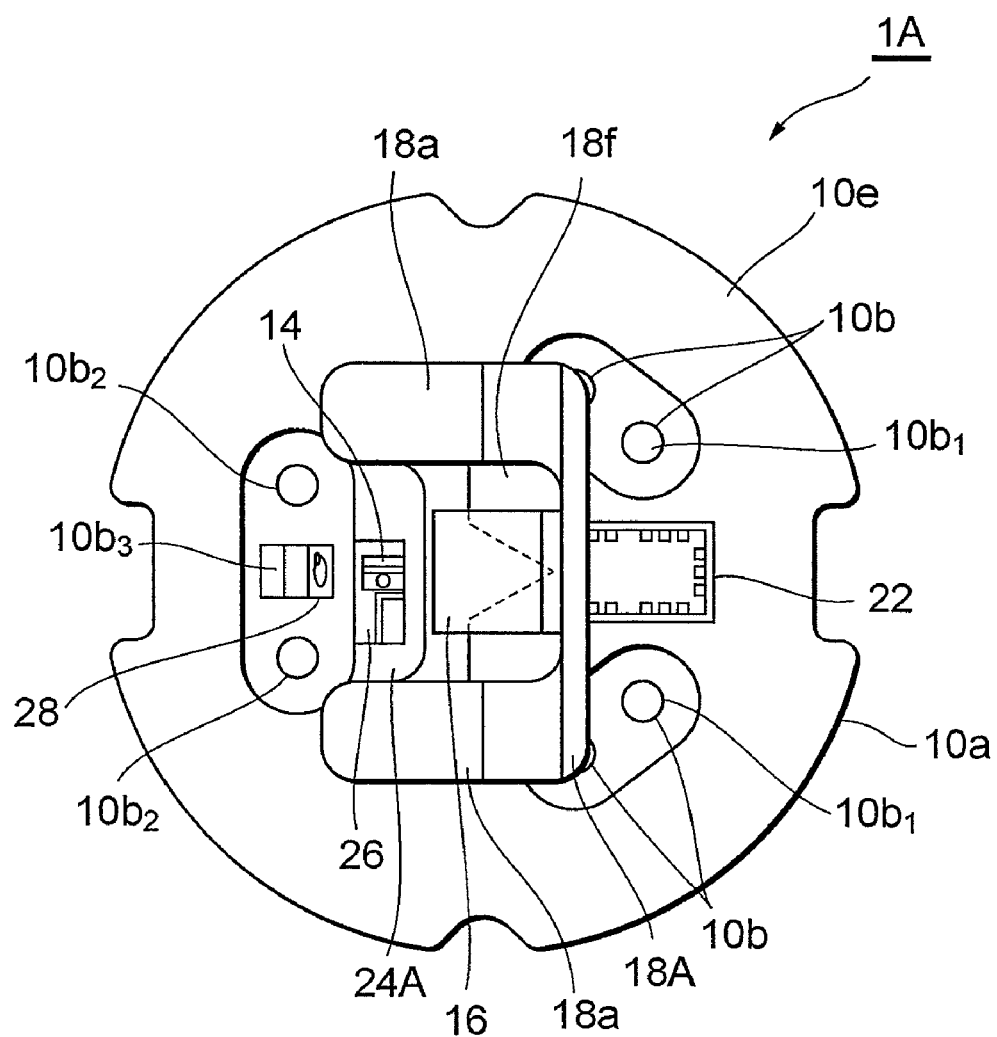
FIG. 9 is a plan view of the optical module according to the second embodiment of the present invention.

FIG. 9 is a plan view of the optical module 1A according to the other embodiment of present invention, where the cap is removed. The optical module 1A shown in FIG. 9 provides the block 18A and the LD sub-mount 24A different from those implemented in the former optical module 1. The block 18A and the LD sub-mount 24A will be describer in detail.

Figure 10:
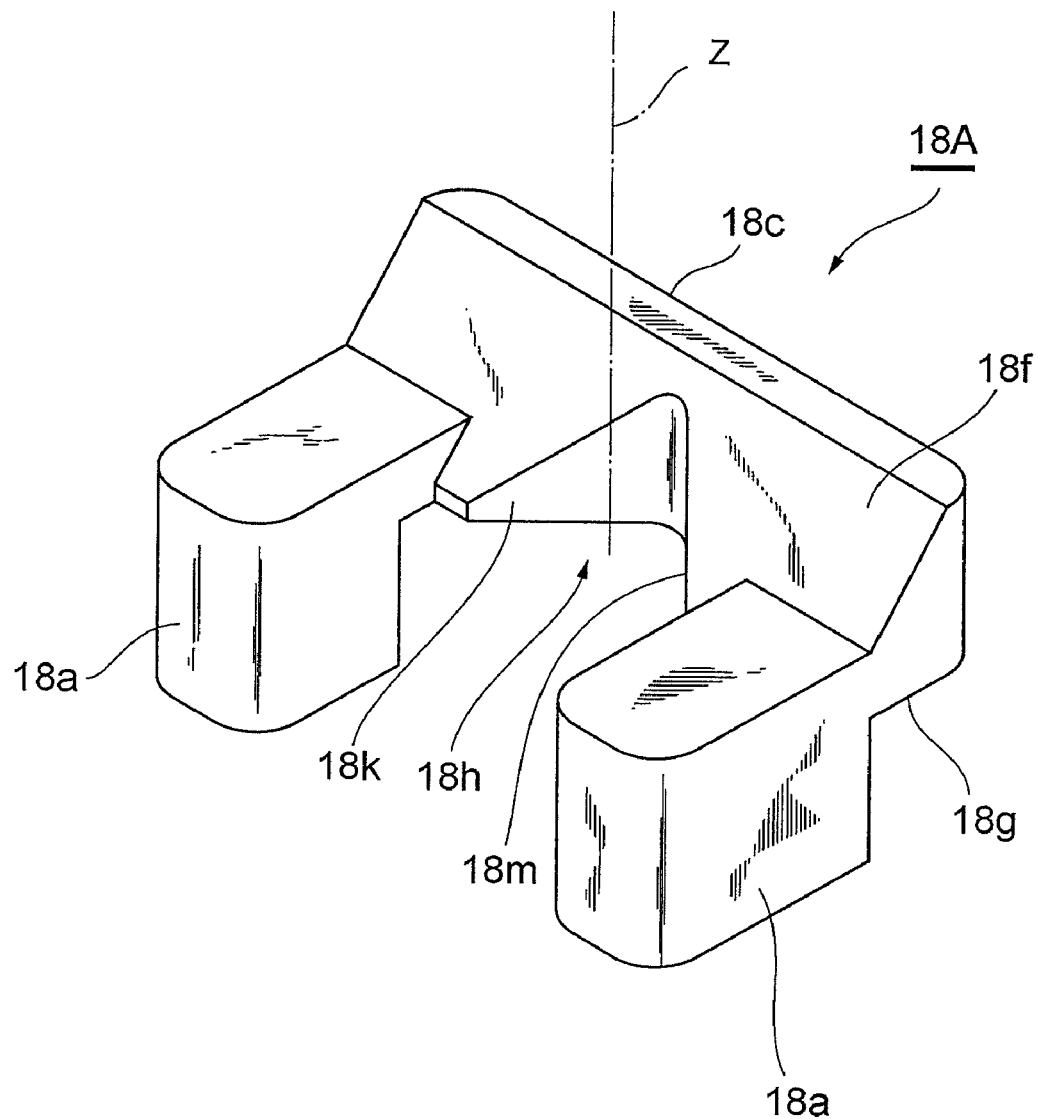
FIG. 10 is a perspective view of the block according to the second embodiment, which implemented on the module shown in FIG. 9.

FIG. 10 is a perspective view of the modified block 18A with an aperture 18h whose horizontal cross section is a triangular shape not the circular aperture. The block 18A has two surfaces, 18k and 18m, each forming the aperture 18h and extending along the direction of the optical axis Z of the PD 12. In the present embodiment, these two surfaces, 18k and 18m, decrease the interval therebetween as they becomes away from the LD 14.

Figure 11:
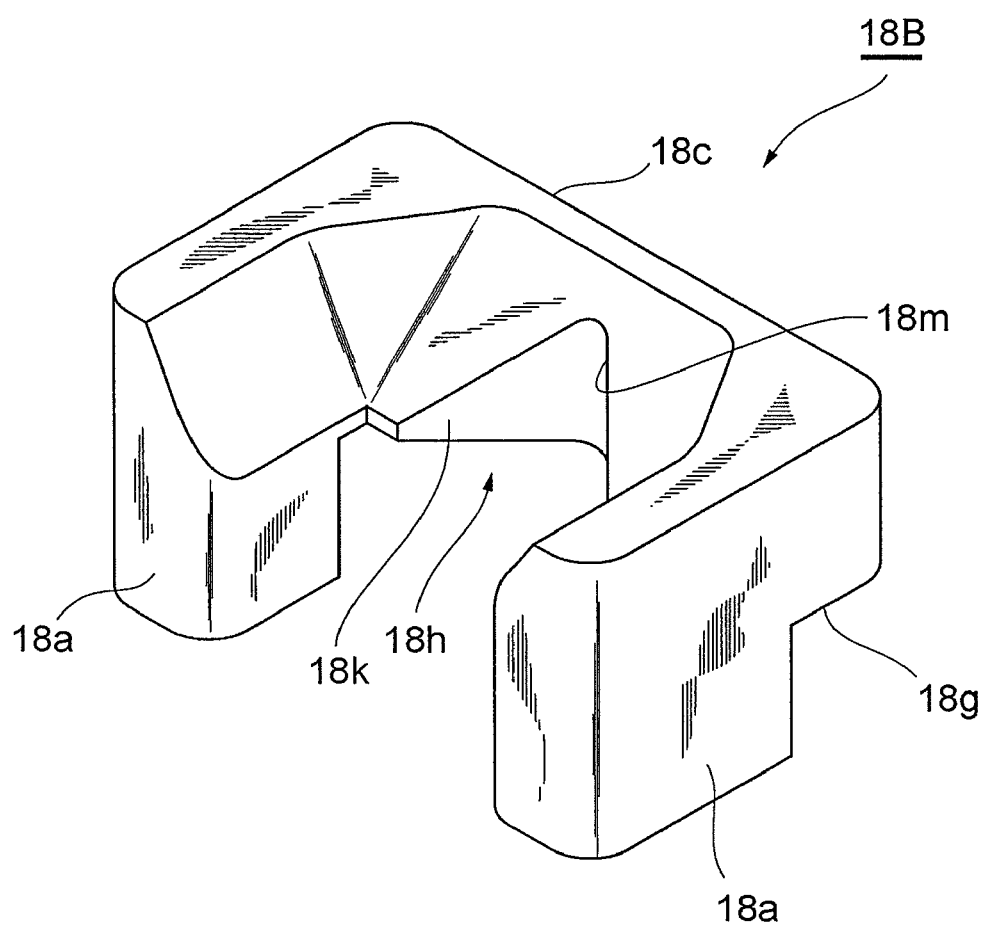
FIG. 11 is a perspective view of the block according to the third embodiment of the present invention, which is modified from the block shown in FIG. 10.

Modified block 18A shown in FIGS. 9 and 10 changes the shape of the opening 18h such that the light reflected even at the surfaces, 18k and 18m, does not enter the PD 12. The aperture 18h has the triangular cross section without one edge thereof in a side close to the LD 14. A portion of the light emitted from the LD 14, passing through the WDM filter 16 mounted on the block 18A and reflected by the surfaces, 18k and 18m, in a side apart from the LD 14 is not reflected again at the opposite edge. Moreover, the side walls 18a of the block have a height smaller than the distance between the slant surface 18f and the primary surface 10e. The horizontal level of the side walls 18a is lower than the slant surface 18f. This arrangement makes it possible to escape the stray light reflected at the surfaces, 18k and 18m, away from the block 18A. The side walls 18a may have the height substantially equal to the height of the slant surface 18f similar to the still another block 18B illustrated in FIG. 11.

These modified blocks, 18A and 18B, eliminate the center partition 18b to isolate the receiver unit from the transmitter unit both electrically and optically. However, the aperture 18h with the triangular cross section may perform the optical isolation as described above. While for the electrical isolation, to mount the LD 14 on the conductive LD sub-mount 24a and to place the block, 18A and 18B, as close as possible to the LD sub-mount 24A such that side walls 18a put the LD sub-mount 24a therebetween as they come in contact thereto, may show the same function with the center partition 18b in the former embodiment.

Fourth Embodiment

Figure 12:
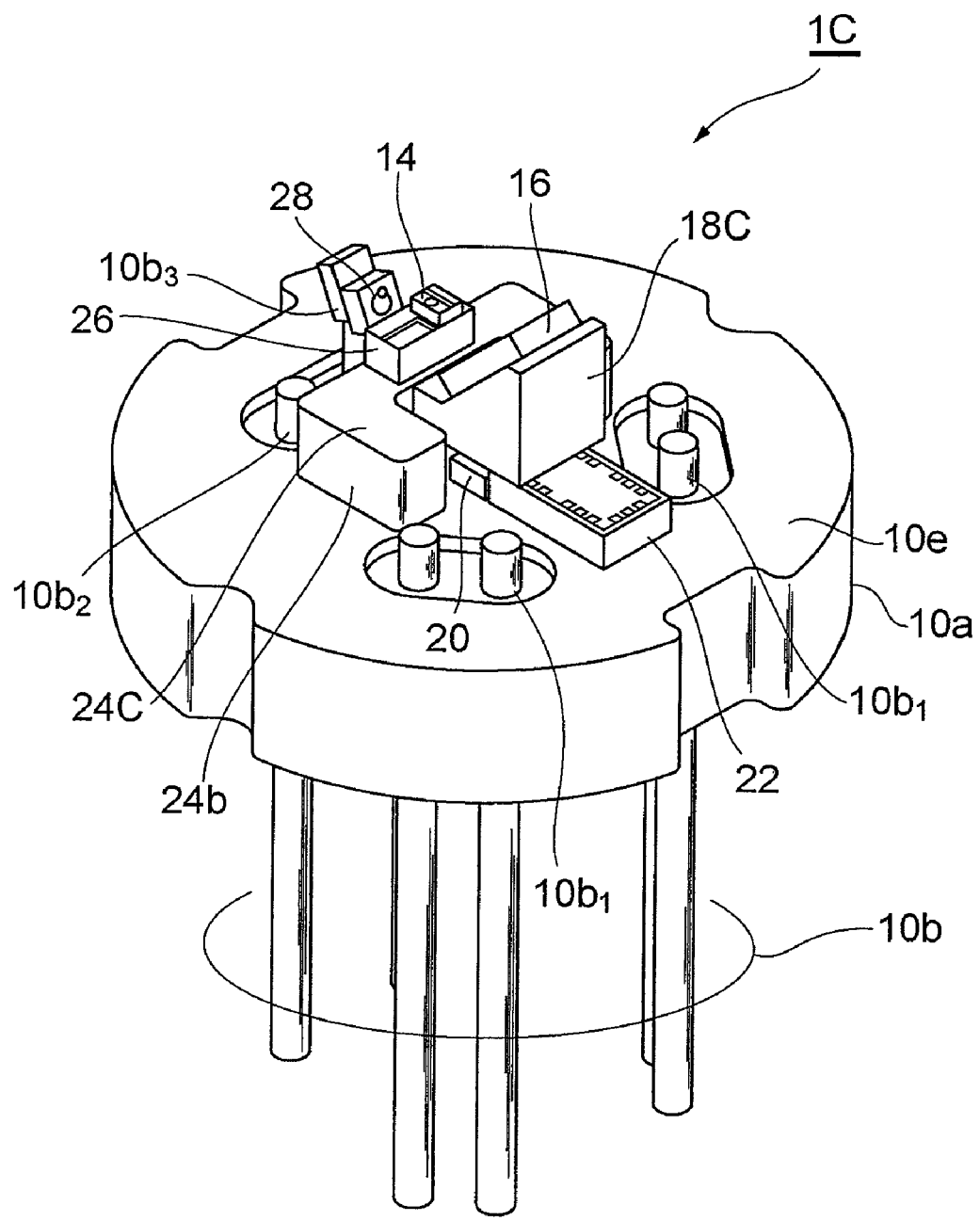
FIG. 12 is a perspective view of the optical module according to the fourth embodiment of the present invention.
Figure 13:
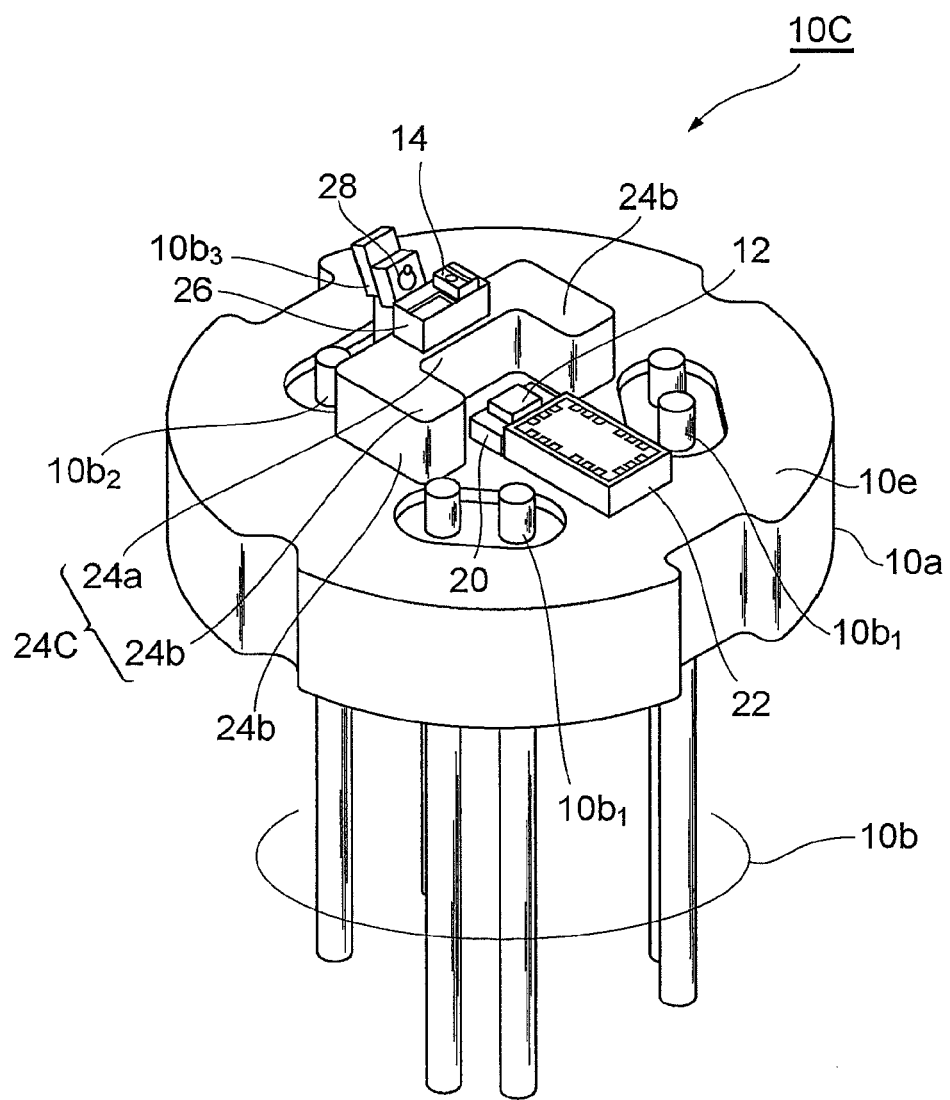
FIG. 13 is a perspective view of the optical module shown in FIG. 12, where the drawing eliminates the block to show the shape of the LD sub-mount clearly.

FIGS. 12 and 13 illustrate another optical module 1C according to fourth embodiment of the invention. FIG. 12 eliminates the cap of the package from the module 1C, while, FIG. 13 eliminates the block 18C from the module 1C shown in FIG. 12. The optical module 1C has the block 18C and the LD sub-mount 24C different from those implemented in the first optical module 1. The modified block 18C illustrated in FIGS. 14 to 16 has a feature different from the former block 18 of the first embodiment in a point that it does not provide the pair of side walls. Instead, the LD sub-mount 24C provides a pair of side walls.

The LD sub-mount 24C comprises a center wall 24a to mount the LD 14 and the wiring substrate 26 thereon and the pair of side walls 24b. Thus, the planar shape of the LD sub-mount 24C is the U-shape. A space formed by the center wall 24a and the side walls 24b arranges the block 18C. A distance between the side walls 24b is slightly greater than a width of the block 18C. The LD 14 is mounted on the center portion 18a through the LD sub-mount 24C. Interconnections provided on the wiring substrate 26 supply the electrical power to the LD 14 from the lead pins $10b_2$ through the bonding-wire.

Figure 14:
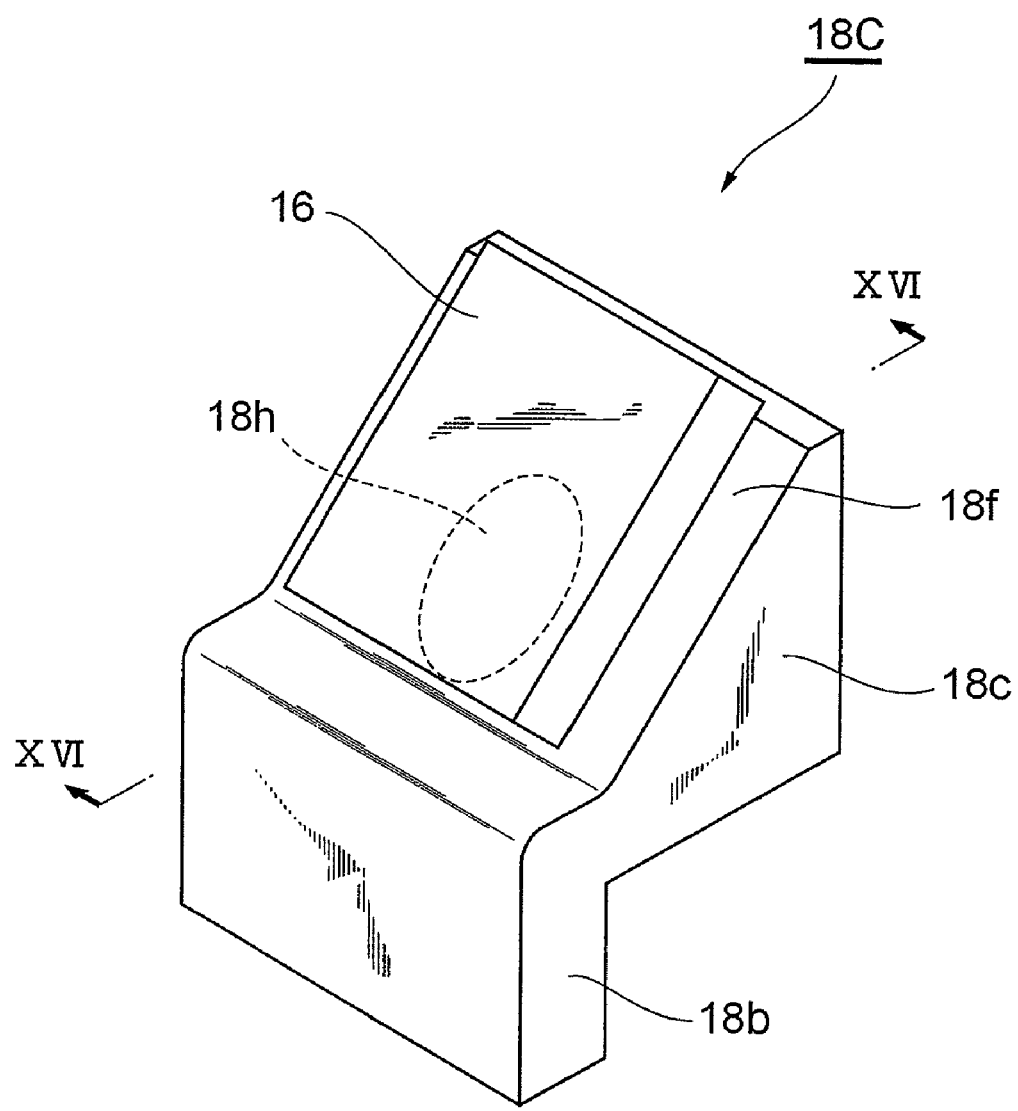
FIG. 14 is a perspective view of the block implemented on the module shown in FIGS. 12 and 13.
Figure 15:
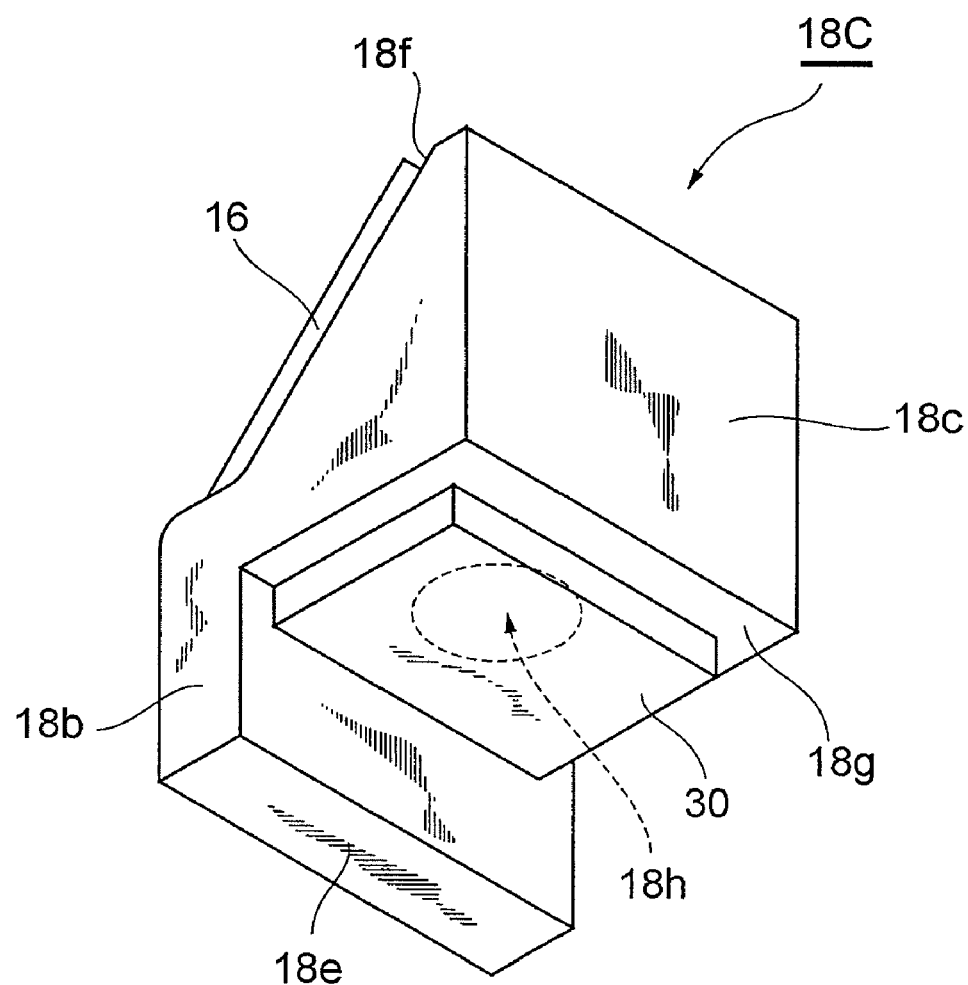
FIG. 15 is a bottom view of the block shown in FIG. 14.
Figure 16:
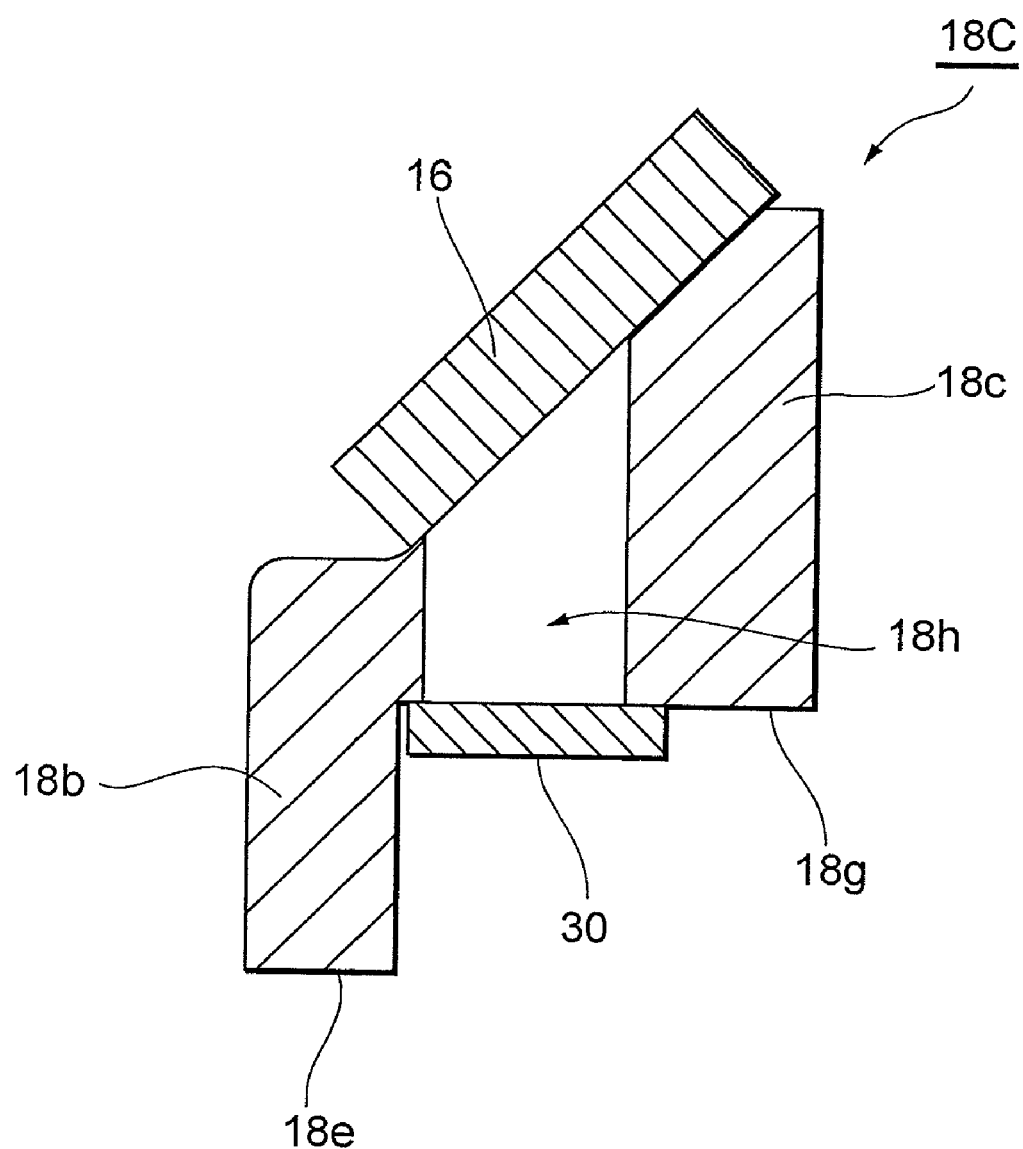
FIG. 16 is a vertical cross section of the block shown in FIGS. 14 and 15.

As illustrated in FIGS. 14 to 16, the block 18C of the present embodiment provides the front wall 18b that corresponds to the center partition of the former block 18, and the support wall 18c extending rearward from the top of the front wall 18b and providing a triangular vertical cross section. The support wall 18c attaches the WDM filter 16 in the slant surface 18f and the optical filter 30 in the bottom surface 18g thereof. This bottom surface 18g positions above the PD 12 to prevent the stray light from entering the PD 12.

The space formed by the front wall 18b, the support wall 18c and the side walls 24b of the LD sub-mount 24C sets the PD 12 therein. The bottom surface 18e of the front wall 18b that comes in directly contact with the primary surface 10e may secure the electrical isolation between the PD 12 and the LD 14. The support wall 18c also provides the aperture 18h for passing the light with the first wavelength therethrough. Thus aperture 18h, similar to the former embodiments, 18A and 18B, may have the triangular horizontal cross section.

Fifth Embodiment

Figure 17:
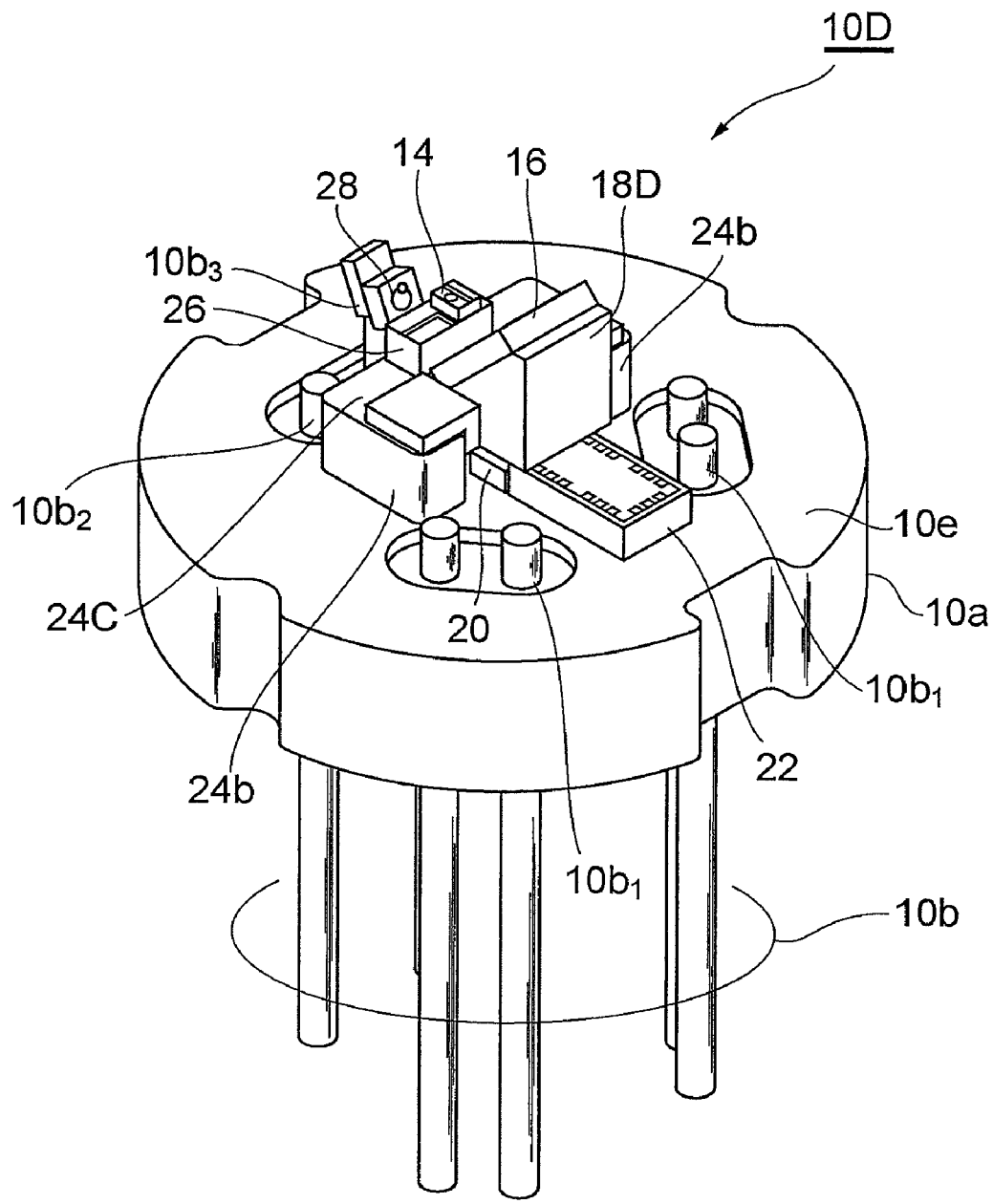
FIG. 17 is a perspective view of the optical module according to the fifth embodiment of the present invention.
Figure 18:
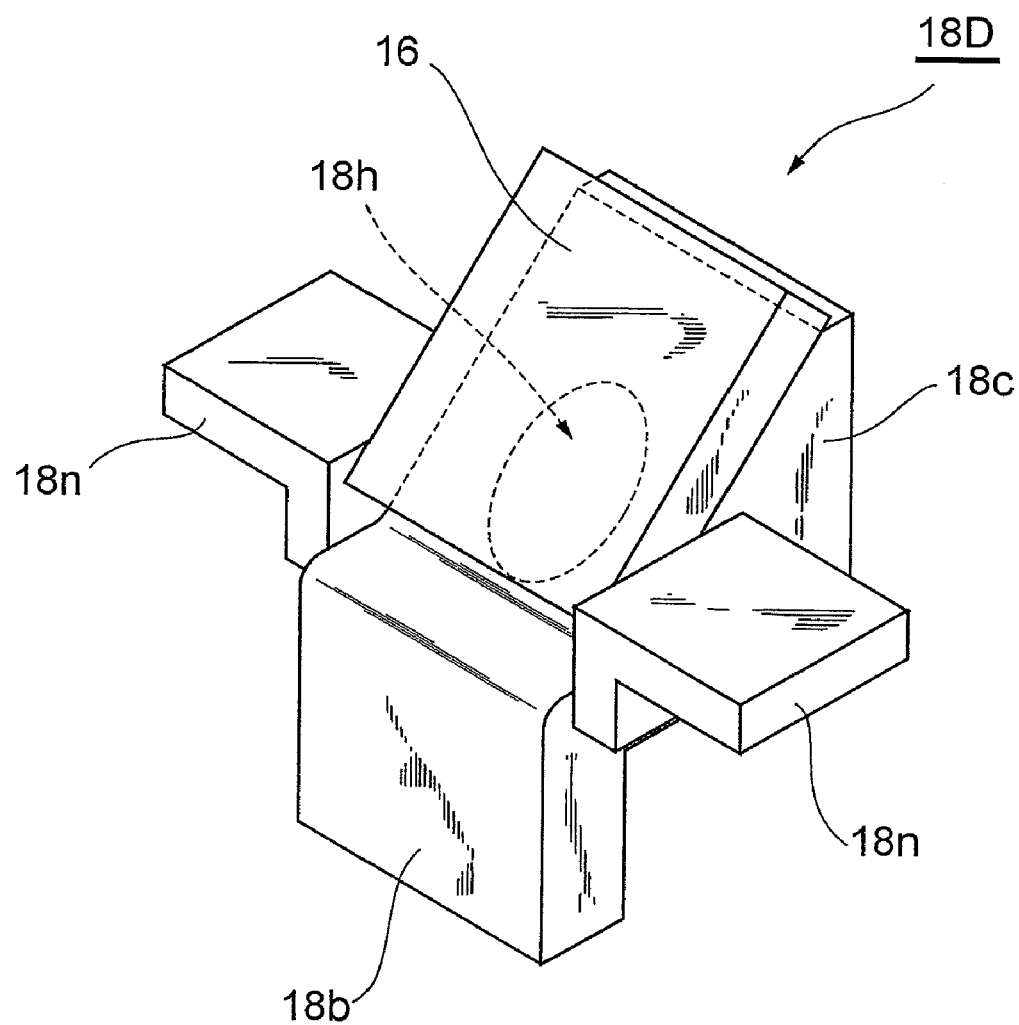
FIG. 18 is a perspective view of the block implemented on the optical module shown in FIG. 17.

FIGS. 17 and 18 show a further modified block 18D, which is based on that 1C shown in FIGS. 14 to 16, and the optical module 1D. The optical module 1D has a feature different from that 1C in a point that the module 1D installs the modified block 18D.

The previous block 18C illustrated in FIG. 14 provides the front wall 18b and the support wall 18c. However, the center of the gravity of this block 18C is in the support wall 18c, which makes it hard to stand the block 18C by itself. As previously described, the optical alignment of the LD 14 and the PD 12 are carried out by sliding the block 18 on the primary surface 10e. The block 18C illustrated in FIGS. 14 to 16 probably makes it hard to align the optical members, or to slide the block 18C on the primary surface 10e. The modified block 18D shown in FIG. 18 provides a pair of flanges 18n in both sides of the support wall 18c. Putting this flange 18n on the side wall 24b and sliding on the top of the side wall 24b, the optical alignment between the LD 14, the PD 12 and the WDM filter 16 may be effectively carried out compared with the optical alignment by the block 18C. Here, a height of the front wall 18b is preferably lower than a height of the side wall 24b of the LD sub-mount 24C to slide the block 18D stably.

Sixth Embodiment

Figure 19:
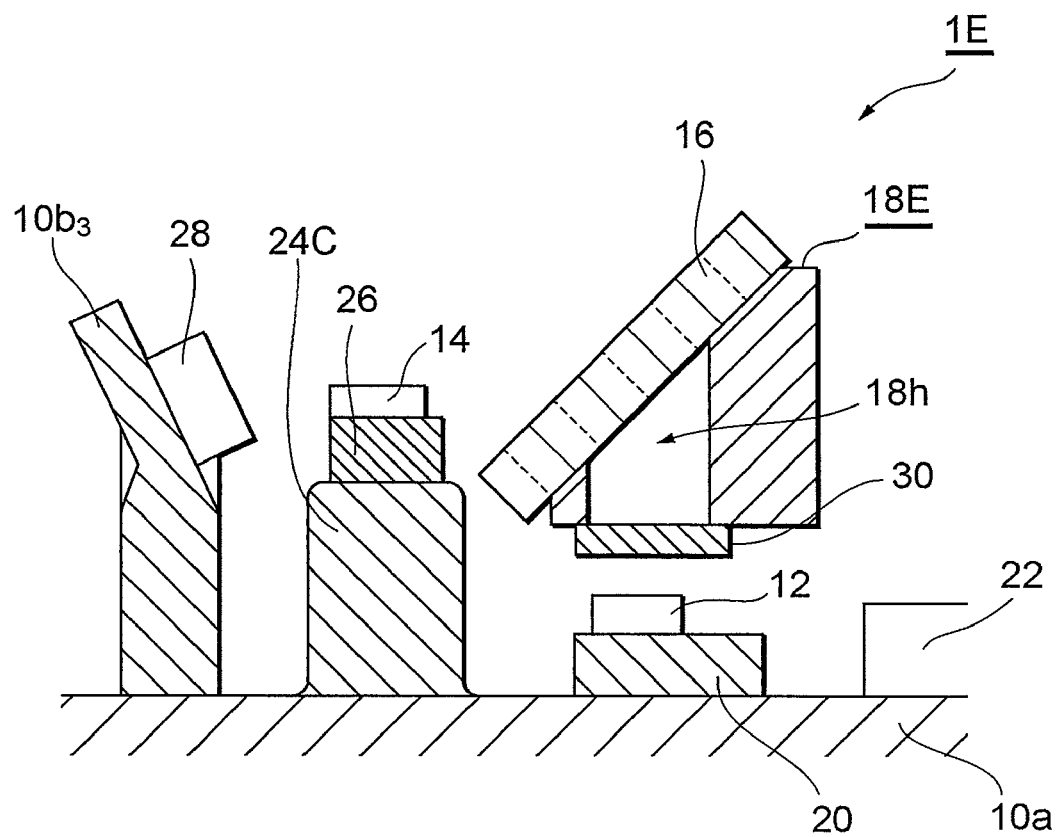
FIG. 19 is a vertical cross section of the primary portion of the optical module according to the sixth embodiment of the present invention.
Figure 20:
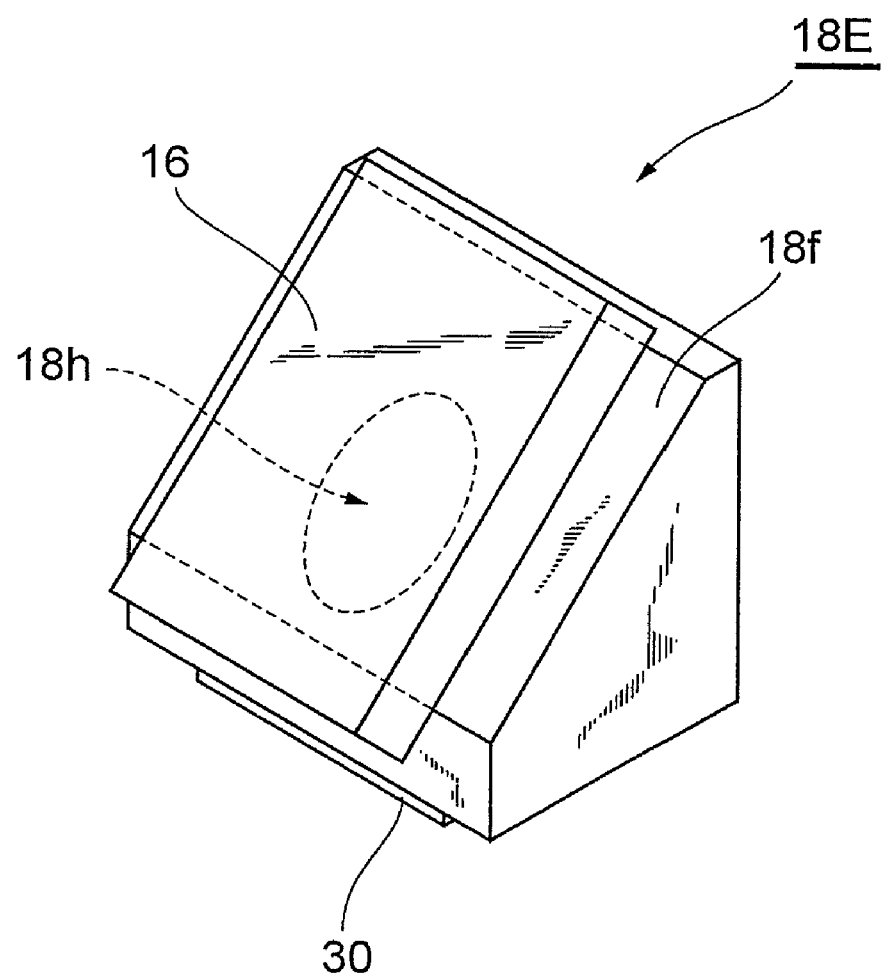
FIG. 20 shows a block according to the sixth embodiment of the present invention, which is implemented on the optical module shown in FIG. 19.

FIGS. form 19 and 20 illustrate still another block 18E, which is based on the block 18C shown in FIGS. 14 and 16. FIG. 20 is a cross section of the primary portion of the module 1E, which includes the PD 12, LD 14 and the WDM filter 16, while, FIG. 19 is a perspective view of the block 18E.

The block 18E of the present embodiment eliminates the front wall 18b. However, the WDM filter 16 extends the bottom end thereof downward compared to any of those previously described, and the slant surface 18f of the support wall for installing the WDM filter 16 thereon is extended downward compared to any of those previously described. As described in connection with FIG. 6, the light emitted from the LD 14 has a considerably divergent angle. The lowermost trace of the light enters the WDM filter 16 by a smaller incident angle in a region where the WDM filter 16 shows the designed reflectivity. Thus, it leaves almost no possibility that the light in this lowermost region becomes the stray light reflected by the WDM filter 16.

However, because the block 18E removes the front wall, the electrical crosstalk between the LD 14 and the PD 12 possibly deteriorates. The embodiment shown in FIGS. 19 and 20 may reduce the crosstalk by extending the lower end of the slant surface 18f toward the side where the LD 14 is mounted. The width of the block 18E is slightly smaller than the gap between the side walls 24b of the LD sub-mount 24 in order to fix the block 18E to the LD sub-mount 24, which is a similar arrangement to those previously described embodiment.

Figure 21:
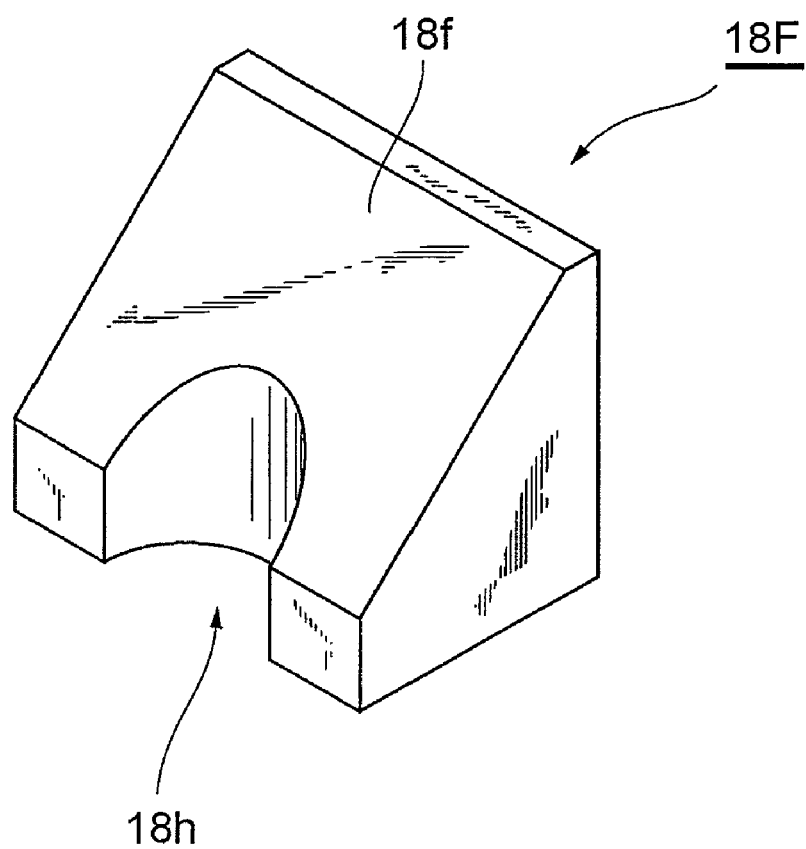
FIG. 21 is a perspective view of the block modified from the block shown in FIG. 20.
Figure 22:
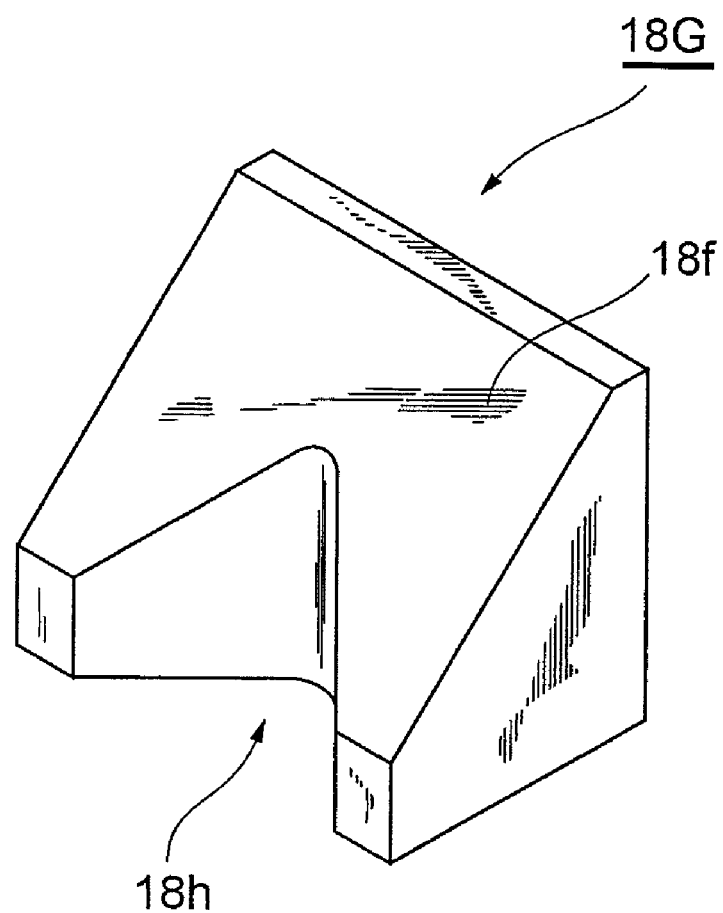
FIG. 22 is a perspective view of the block still modified from the block shown in FIG. 20.

FIGS. 21 and 22 show other blocks modified from the block 18E shown in FIG. 20. These blocks, 18F and 18G, provide the aperture 18h whose horizontal cross section is semicircular and triangular, respectively, with an open end in a side closer to the LD 14. As described previously, when the aperture 18h has a circular shape or a half circular shape, a magnitude of the stray light reflected at the edge surface of the aperture 18h becomes quite small in a limited direction because the curved surface reflects the light evenly but not completely zero, which leaves the substantial stray light. In the arrangement of the LD 14 and the WDM filter 16, the uppermost trace of the light from the LD 14 may pass the WDM filter 16, iterates the reflection within the WDM filter 16, becomes the stray light reflected at the lower end of the WDM filter 16, and possibly enter the PD 12. By removing one end of the aperture 18h, or, forming the edge surface of the aperture 18h in addition to this removal such that, even the reflection occurs at the edge surfaces, the reflected light does not advance the PD 12, then the optical crosstalk between the PD 12 and the LD 14 may be further improved.

Seventh Embodiment

Figure 23:
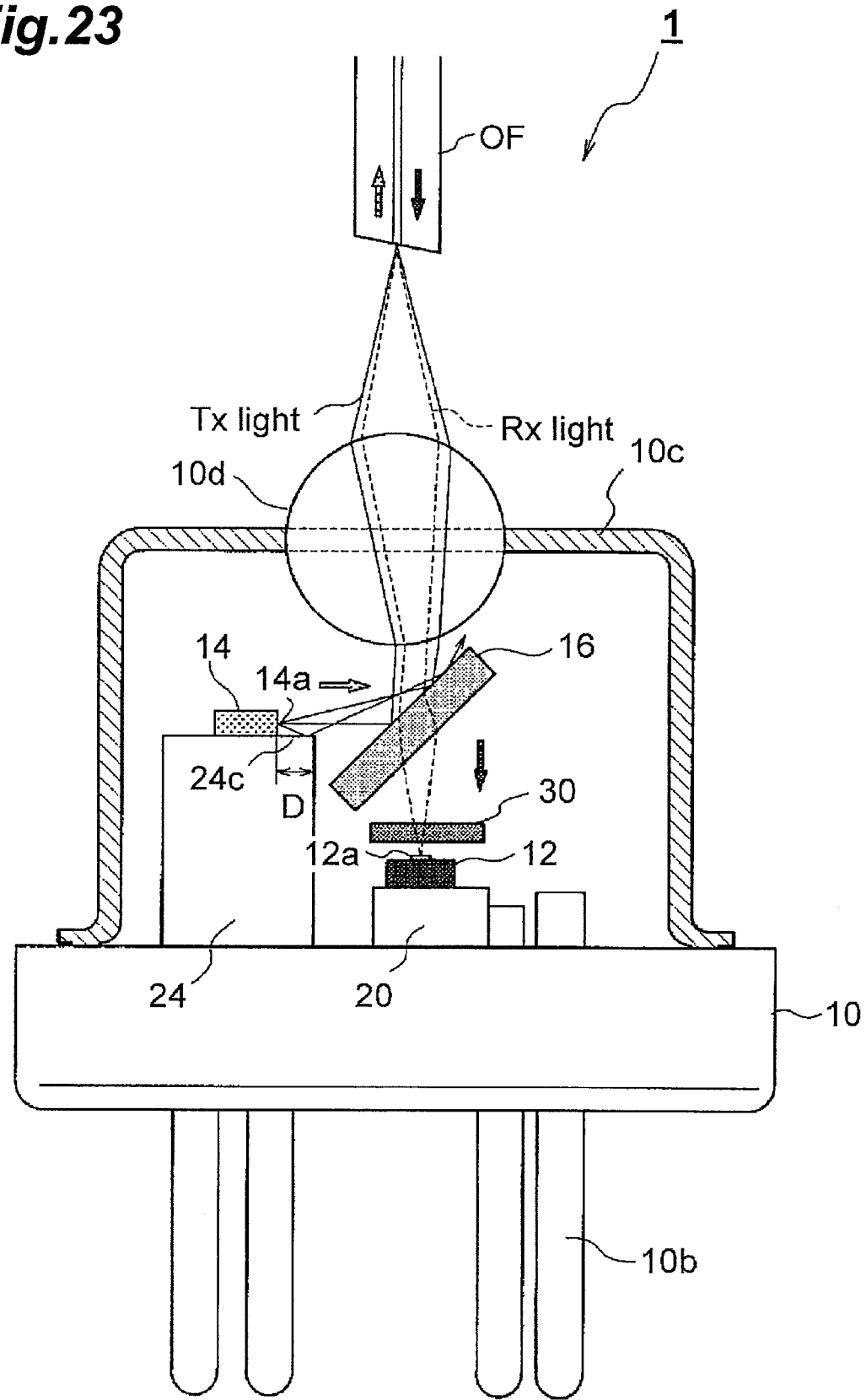
FIG. 23 schematically illustrates the optical module according to the seventh embodiment of the present invention.

Next, the LD sub-mount 24 will be further investigated. In the optical arrangement between the LD 14 and the WDM filter according to the embodiments, the uppermost trace of the light emitted from the output facet 14a of the LD 14 makes the largest incident angle with respect to the WDM filter 16; so the optical arrangement of the present invention possibly inhibits the uppermost trace of the light from entering the PD 12. On the other hand, the lowermost trace of the light, namely, the light propagating along the line connecting the output facet 14a of the LD 14 with the optically sensitive surface 12a of the PD 12 has possibility to enter the PD 12 passing through the WDM filter 16 and the optical filter 30. FIG. 23 schematically illustrates this optical arrangement between the devices within the package 10. The LD sub-mount 24 according to the present embodiment provides an extension 24c in the side closer to the PD 12, namely, the LD 14 is mounted on the top of the LD sub-mount 24 so as to form a dead area with the width D from the edge in the side of the PD 12.

Figure 24:
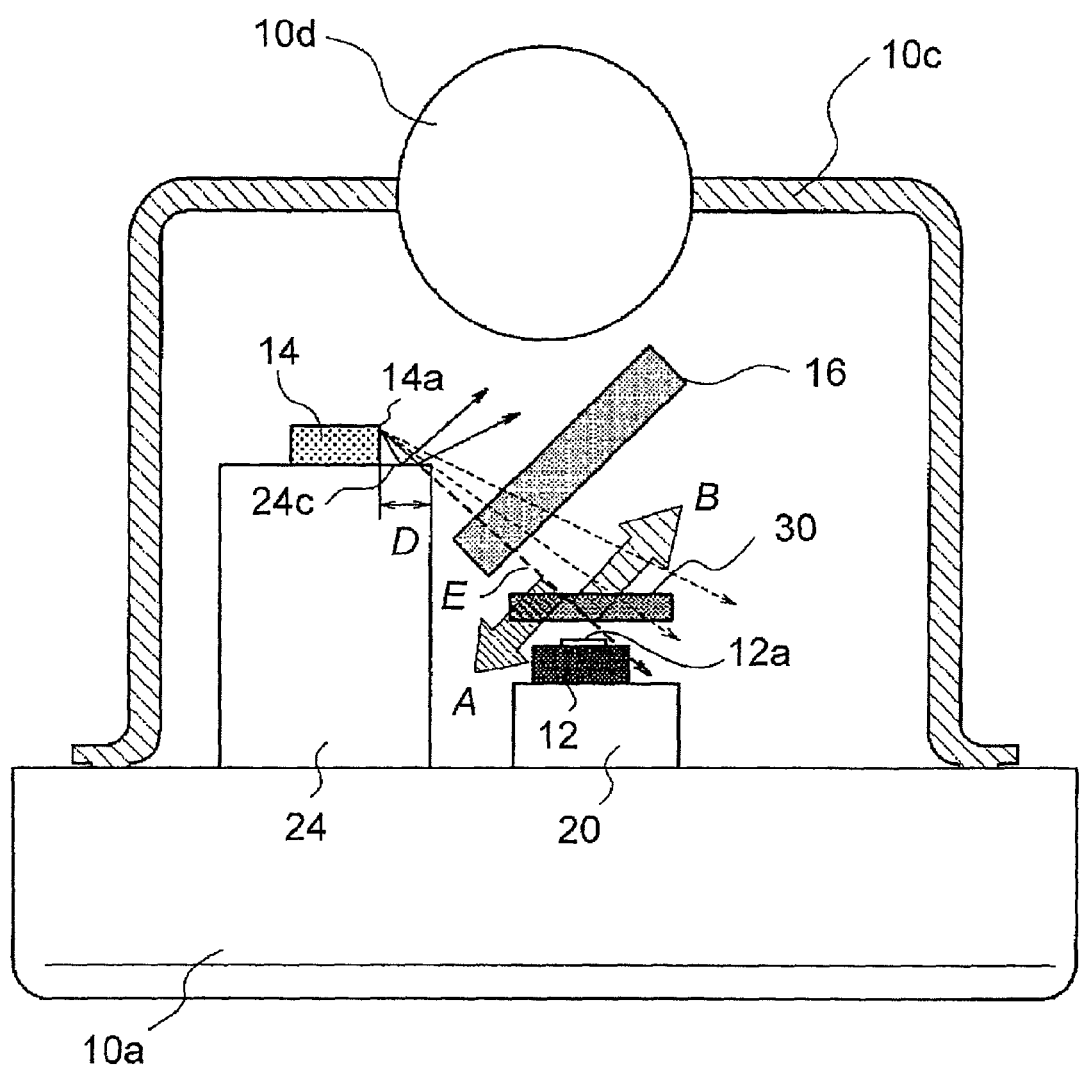
FIG. 24 schematically explains the optical arrangement of the LD, the LD sub-mount, the WDM filter, and the PD, where the lowermost trace of the light emitted from the LD is reflected at the dead area secured on the top of the LD sub-mount to be prevented from entering the PD.

As schematically illustrated in FIG. 24, the lowermost trace of the light emitted from the facet 14a of the LD 14, which makes the smallest incident angle to the WDM filter 16, may be effectively reflected by the top surface 24c of the LD sub-mount 24. Drawing the virtual line E from the facet 14a to the far end of the sensitive surface 12a of the PD 12, the width D of the dead area is set such that the portion of light whose ray trace is below this virtual line E, which is illustrated by the symbol A in FIG. 24, is effectively reflected by the top surface 24c. Thus, the portion of the light involved in the area A may be effectively prevented from entering the sensitive surface 12a of the PD 12.

The portion of the light from the LD 12 whose trace is in the above of the virtual line E, which is denoted by the symbol B in FIG. 24, is not reflected by the dead area and may pass the WDM filter 16 and the optical filter 30 but not directly enter the PD 12. Such stray light may reach the PD 12 after iterating the reflection by the cap 10c and being considerably attenuated.

Two types of the BOSA have been known. One type has a configuration that transmits light with a wavelength of 1.31 μm and receives light with a wavelength of 1.49 μm, which is applied in the optical network unit (hereafter denoted as ONU) in the passive optical network system. While, another type of the module has a configuration that transmits light with a wavelength of 1.49 μm while receives light with a wavelength of 1.31 μm, which is applied in the center station and called as the optical line terminal (hereafter denoted as OLT). These two types of the BOSA provide the WDM filter with a specific performance adequate to respective applications, namely, the ONU or the OLT.

Figure 25:
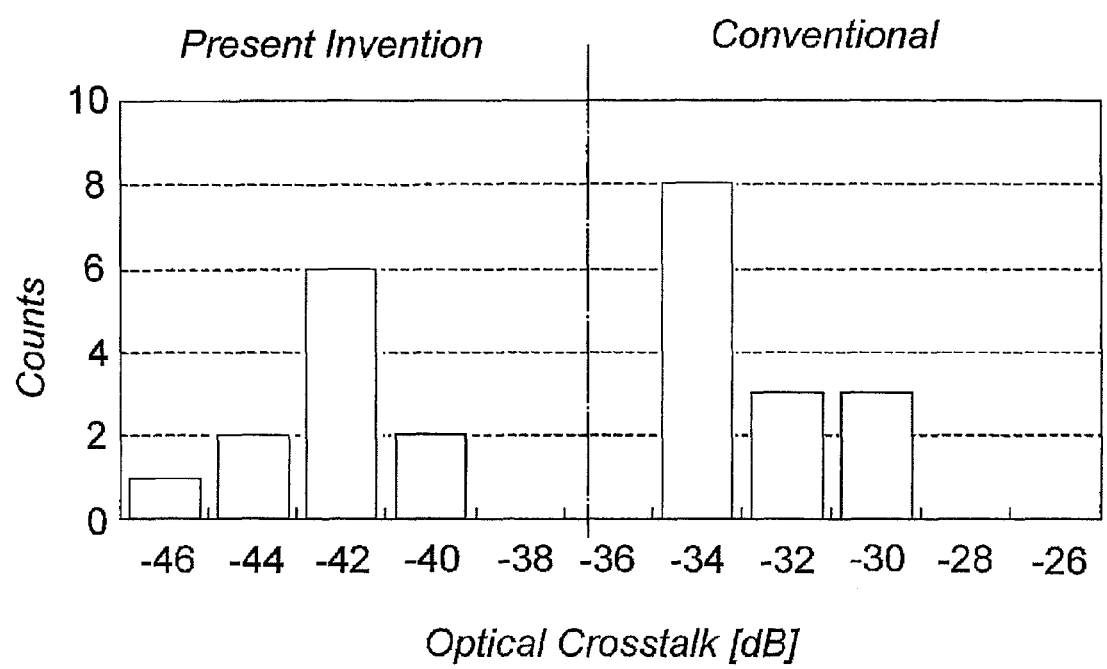
FIG. 25 compares the crosstalk between the transmitter unit and the receiver unit in the optical module shown in FIGS. 23 and 24 with the module having the conventional arrangement.
Figure 26A:
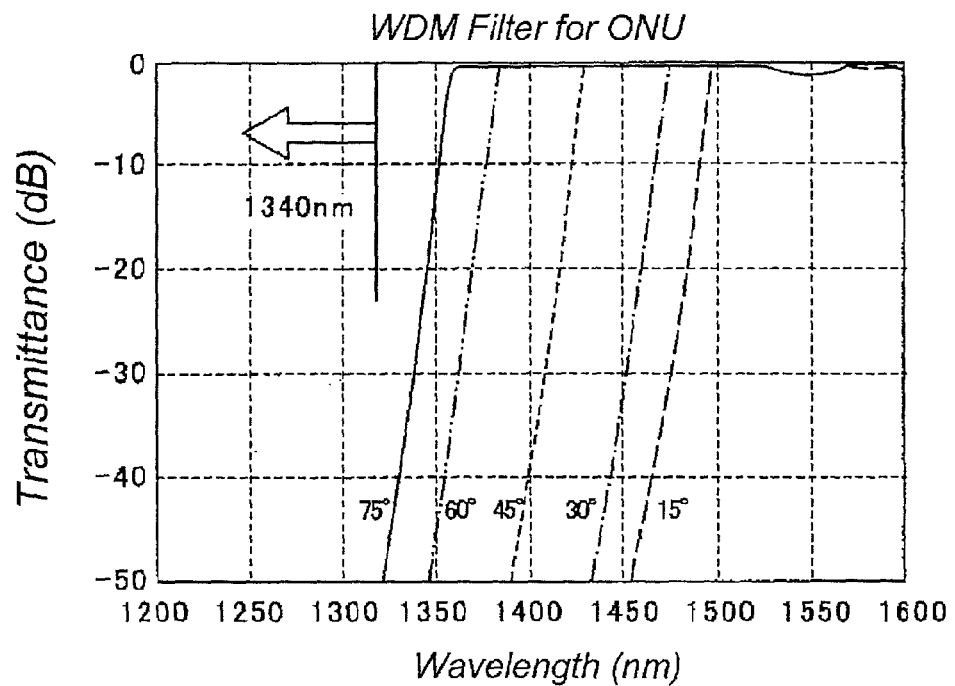
Figure 26B:
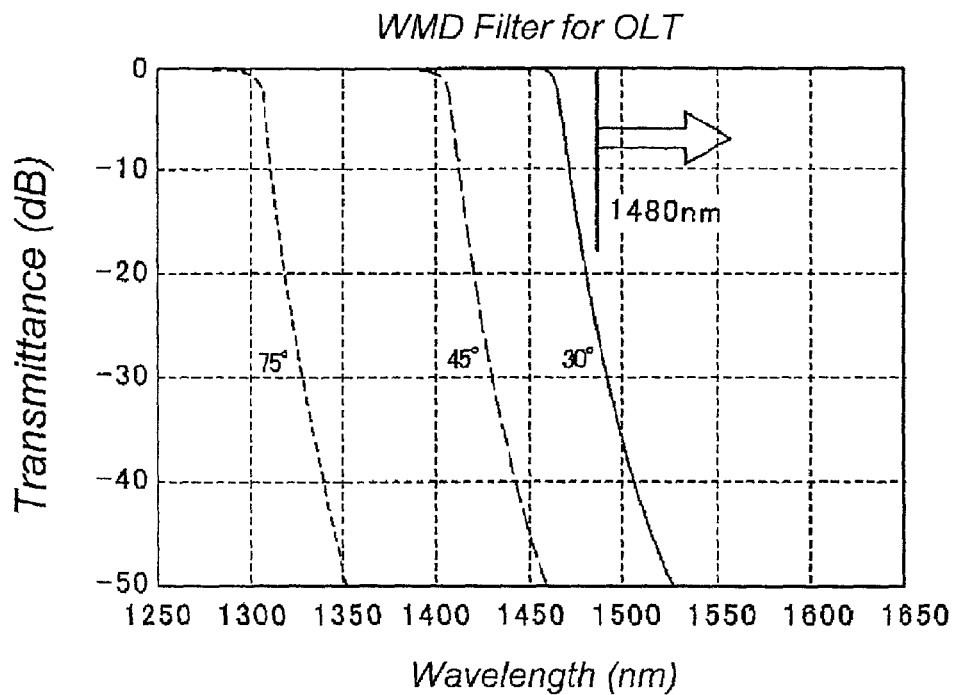
FIG. 26B is the transmittance of the WD<filter for the OLT application.

In the ONU application, the WDM filter 16 used therein is necessary to reflect light with the wavelength of 1.31 μm, while, it transmits light with the wavelength of 1.49 μm. As illustrated in FIG. 27A, the WDM filter 16 effectively reflects, or prevents from transmitting, light with the wavelength of 1.31 μm even the incident angle of the light becomes smaller. On the other hand, the WDM filter 16 is necessary to reflect light with the wavelength of 1.49 μm, while, it transmits light with the wavelength of 1.31 μm. However, as illustrated in FIG. 27B, the WDM filter 16 for the OLT application remains substantial transmittance for the light with the wavelength of 1.49 μm when the incident angle becomes smaller. The angle 30° often encounters in the practical BOSA. For such an arrangement, the reflection of the light from the LD 12 by the dead area provided on the LD sub-mount 24 may FIG. 25 compares the optical crosstalk detected in the BOSA whose arrangement reflects the present embodiment of the invention with those detected in the conventional BOSA. The conventional BOSAs showed the crosstalk in a range from −30 to −34 dB with an average of around −33 dB. On the other hand, the BOSAs with the arrangement according to the present embodiment indicated the crosstalk from −40 to −46 dB with an average of around −45 dB.

While the preferred embodiments of the present invention have been described in detail above, many changes to these embodiments may be made without departing from the true scope and teachings of the present invention. The present invention, therefore, is limited only as claimed below and the equivalents thereof.

What is claimed is:

1. An optical module to transmit first light with a first wavelength to an optical fiber and to receive light with a second wavelength from said optical fiber, comprising:

a light-emitting device configured to emit said first light;
a light-receiving device configured to receive said second light;
a WDM filter configured to reflect said first light emitted from said light-emitting device and to transmit said second light provided from said optical fiber to said light-receiving device;
a block including a slant surface and a bottom surface, said slant surface securing said WDM filter thereon, said bottom surface facing said light-receiving device; and
a package providing a circular primary surface to mount said light-emitting device, said light-receiving device, said block securing said WDM filter, wherein said block provides an aperture connecting said slant surface with said bottom surface to transmit said second light.

2. The optical module according to claim 1, wherein said aperture has a triangular cross section in parallel to said primary surface.

3. The optical module according to claim 2, wherein said aperture with said triangular cross section has at least two surfaces whose distance becomes narrower with a distance from said light-emitting device.

4. The optical module according to claim 1, wherein said block further provides a pair of side walls and a support wall set between said side walls, said support wall having said slant surface and said bottom surface, and wherein said side walls, said bottom surface and said primary surface of said package form a space where said light-receiving device is enclosed.

5. The optical module according to claim 4, further comprising a sub-mount for mounting said light-emitting device thereon, wherein said sub-mount is put between said side walls of said block, said space to enclose said light-receiving device being formed by said side walls, said bottom surface, said primary surface and said sub-mount.

6. The optical module according to claim 1, wherein said block further provides a support wall and a front wall connected with said support wall in a side of said light-emitting device, said support wall providing said slant surface and said bottom surface, and wherein said front wall, said bottom surface and said primary surface of said package form a space where said light-receiving device is enclosed.

7. The optical module according to claim 6, further comprising a sub-mount for mounting said light-emitting device thereon, wherein said sub-mount has a pair of side walls configured to put said block therebetween, wherein said side walls of said sub-mount, said front wall, said bottom surface and said primary surface form a space where said light-receiving device is enclosed.

8. The optical module according to claim 6, wherein said front wall has a bottom surface coming in contact with said primary surface of said package.

9. The optical module according to claim 1, further comprising a sub-mount for mounting said light-emitting device thereon, wherein said sub-mount has a dead area on a top surface thereof to reflect a portion of said first light emitted from said light-emitting device whose ray trace comes within a region determined by a virtual line connecting a light-emitting surface of said light-emitting device with a far end of a light-sensitive surface of said light-receiving device.

10. The optical module according to claim 1, wherein said block is made of electrically conductive material.

11. The optical module according to claim 1, wherein said bottom surface of said block attaches an optical filter to cut light with said first wavelength.

* * * * *